United States Patent
Satou et al.

(10) Patent No.: US 8,758,978 B2
(45) Date of Patent: Jun. 24, 2014

(54) RADIATION-SENSITIVE RESIN COMPOSITION, RESIST PATTERN FORMATION METHOD, AND POLYMER

(75) Inventors: Mitsuo Satou, Tokyo (JP); Tomohiro Kakizawa, Tokyo (JP)

(73) Assignee: JSR Corporation, Tokyo (JP)

( * ) Notice: Subject to any disclaimer, the term of this patent is extended or adjusted under 35 U.S.C. 154(b) by 119 days.

(21) Appl. No.: 13/417,335

(22) Filed: Mar. 12, 2012

(65) Prior Publication Data

US 2012/0171612 A1 Jul. 5, 2012

Related U.S. Application Data

(63) Continuation of application No. PCT/JP2010/066758, filed on Sep. 28, 2010.

(30) Foreign Application Priority Data

Sep. 28, 2009 (JP) .................................. 2009-222622

(51) Int. Cl.
| | |
|---|---|
| G03F 7/004 | (2006.01) |
| G03F 7/40 | (2006.01) |
| C08F 18/20 | (2006.01) |
| C08F 26/00 | (2006.01) |

(52) U.S. Cl.
USPC ........ 430/270.1; 430/326; 430/396; 526/245; 526/248

(58) Field of Classification Search
USPC ...................... 430/270.1, 326; 526/245, 248
See application file for complete search history.

(56) References Cited

U.S. PATENT DOCUMENTS

| | | | |
|---|---|---|---|
| 2006/0234164 A1 | 10/2006 | Rhodes et al. | |
| 2006/0235174 A1 | 10/2006 | Rhodes et al. | |
| 2009/0011365 A1* | 1/2009 | Kobayashi et al. | ........ 430/284.1 |
| 2009/0286182 A1* | 11/2009 | Harada et al. | .............. 430/285.1 |
| 2011/0065878 A1 | 3/2011 | Rhodes et al. | |

FOREIGN PATENT DOCUMENTS

| | | |
|---|---|---|
| JP | 2004-307411 | 11/2004 |
| JP | 2004307411 A * | 11/2004 |
| JP | 2006-291177 | 10/2006 |
| JP | 2006-321770 | 11/2006 |
| JP | 2008-015422 | 1/2008 |
| JP | 2008-133312 | 6/2008 |
| JP | 2009-031767 | 2/2009 |

OTHER PUBLICATIONS

Sasaki et al., JP 2004-307411A, English Translation (2004).*
International Search Report for corresponding International Application No. PCT/JP2010/066758, Oct. 26, 2010.
Written Opinion for corresponding International Application No. PCT/JP2010/066758, Oct. 26, 2010.

* cited by examiner

*Primary Examiner* — Amanda C. Walke
(74) *Attorney, Agent, or Firm* — Ditthavong Mori & Steiner, P.C.

(57) ABSTRACT

A radiation-sensitive resin composition includes a first polymer, a second polymer and a radiation-sensitive acid generator. The first polymer includes a repeating unit (I) shown by the following general formula (1), a fluorine atom in a molecule of the first polymer. The second a polymer includes an acid-labile group, and is insoluble or scarcely soluble in an alkali. $R^1$ represents a hydrogen atom or the like, each of $X^1$ and $R^2$ represents a single bond or the like, $R^3$ represents a hydrogen atom or the like, and $R^4$ represents an acid-labile group.

(1)

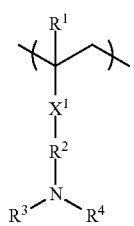

18 Claims, No Drawings

RADIATION-SENSITIVE RESIN COMPOSITION, RESIST PATTERN FORMATION METHOD, AND POLYMER

CROSS-REFERENCE TO RELATED APPLICATIONS

The present application is a continuation application of International Application No. PCT/JP2010/066758, filed Sep. 28, 2010, which claims priority to Japanese Patent Application No. 2009-222622, filed Sep. 28, 2009. The contents of these applications are incorporated herein by reference in their entirety.

BACKGROUND OF THE INVENTION

1. Field of the Invention

The invention relates to a radiation-sensitive resin composition, a resist pattern-forming method, and a polymer.

2. Discussion of the Background

In the field of microprocessing represented by production of integrated circuit devices, a reduction in line width implemented by lithography has progressed in order to achieve a higher degree of integration. Therefore, use of radiation having a shorter wavelength has been extensively studied. Examples of short-wavelength radiation include a bright line spectrum of a mercury lamp (wavelength: 254 nm), far ultraviolet rays (e.g., KrF excimer laser (wavelength: 248 nm) and ArF excimer laser (wavelength: 193 nm)), X-rays (e.g., synchrotron radiation), and charged particle rays (e.g., electron beams). In particular, lithography that utilizes excimer laser light has attracted attention due to high output, high efficiency, and the like.

It has been desired for a resist used for lithography to form a fine pattern with high sensitivity, high resolution, and good reproducibility when using excimer laser. A chemically-amplified resist that includes a radiation-sensitive acid generator that generates an acid upon exposure to radiation, and exhibits improved sensitivity due to the acid has been proposed as a resist that is suitable for far ultraviolet rays (e.g., excimer laser).

A chemically-amplified resist composition that includes an acid diffusion controller has been disclosed (see Patent Documents 1 and 2, for example). The acid diffusion controller controls diffusion of an acid generated by the radiation-sensitive acid generator in the resist film, and suppresses undesirable chemical reactions in the unexposed area. The resist composition exhibits improved storage stability, and the resulting resist film exhibits improved resolution. Moreover, a change in line width of the resist pattern due to a change in post-exposure delay (PED) from exposure of radiation to heat treatment after exposure can be suppressed (i.e., the process stability can be improved).

However, it has been desired to form a finer resist pattern (e.g., a fine resist pattern having a line width of about 45 nm) in the field of microprocessing. Such a fine pattern may be formed by reducing the wavelength of the light source of the exposure system, or increasing the numerical aperture (NA) of the lens, for example. However, an expensive exposure system is required to reduce the wavelength of the light source. When increasing the numerical aperture of the lens, a decrease in depth of focus may occur even if the resolution increases since the resolution and the depth of focus have a trade-off relationship.

In recent years, liquid immersion lithography has been proposed as lithographic technology that can solve the above problem. Liquid immersion lithography provides an immersion liquid (e.g., purified water or fluorine-containing inert liquid) between the lens and the resist film (over the resist film) during exposure. According to liquid immersion lithography, since the exposure optical path (space) is filled with an immersion liquid that has a refractive index (n) higher than that of air and the like instead of air or an inert gas (e.g., nitrogen), the same effect as that achieved when reducing the wavelength of exposure light can be achieved even when the previously used exposure light is utilized. Specifically, high resolution can be obtained while preventing a decrease in depth of focus.

According to liquid immersion lithography, a resist pattern that exhibits high resolution and an excellent depth of focus can be inexpensively formed using the lens provided in an existing system. For example, JP 2008-133312 A and JP 2009-031767 A disclose a resist composition used for liquid immersion lithography.

SUMMARY OF THE INVENTION

According to one aspect of the present invention, a radiation-sensitive resin composition includes a first polymer, a second polymer and a radiation-sensitive acid generator. The first polymer includes a repeating unit (I) shown by a general formula (1), and a fluorine atom in a molecule of the first polymer. The second polymer includes an acid-labile group, is insoluble or scarcely soluble in an alkali, and not includes the repeating unit (I) shown by the general formula (1).

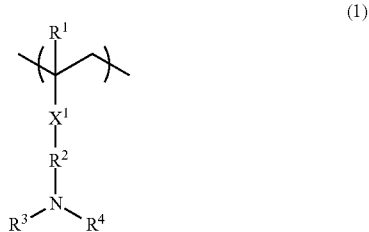

$R^1$ represents a hydrogen atom, a methyl group, or a trifluoromethyl group. $X^1$ represents a single bond, a group shown by —O—$R^5$—, a group shown by —C(=O)—O—$R^5$—, a group shown by —C(=O)—NH—$R^5$—, a linear or branched alkanediyl group having 1 to 4 carbon atoms, or a phenylene group, wherein $R^5$ represents a single bond, a linear, branched, or cyclic hydrocarbon group having 1 to 10 carbon atoms which optionally includes an ester group or an ether group. $R^2$ represents a single bond, a linear, branched, or cyclic alkanediyl group having 1 to 20 carbon atoms and being substituted or unsubstituted, a substituted or unsubstituted alkenylene group having 2 to 20 carbon atoms, a substituted or unsubstituted arylene group having 6 to 10 carbon atoms, or a substituted or unsubstituted aralkylene group. $R^3$ represents a hydrogen atom, a linear, branched, or cyclic alkyl group having 1 to 20 carbon atoms and being substituted or unsubstituted, a substituted or unsubstituted alkenyl group having 2 to 20 carbon atoms, a substituted or unsubstituted aryl group having 6 to 10 carbon atoms, or a substituted or unsubstituted aralkyl group. Or $R^2$ and $R^3$ bond to each other to form a cyclic structure having 3 to 20 carbon atoms together with a nitrogen atom bonded to $R^2$ and $R^3$. $R^4$ represents an acid-labile group.

According to another aspect of the present invention, a resist pattern-forming method includes providing a resist film on a substrate using the radiation-sensitive resin composition. The resist film is exposed. The exposed resist film is developed to form a resist pattern.

According to further aspect of the present invention, a polymer includes a repeating unit (3) shown by a general formula (3), and a fluorine atom in the molecule of the polymer.

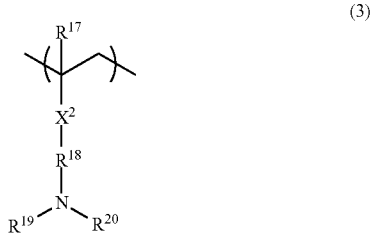

(3)

$R^{17}$ represents a hydrogen atom, a methyl group, or a trifluoromethyl group. $X^2$ represents a single bond, a group shown by —O—$R^{21}$—, a group shown by —C(=O)—O—$R^{21}$—, a group shown by —C(=O)—NH—$R^{21}$—, a linear or branched alkanediyl group having 1 to 4 carbon atoms, or a phenylene group, wherein $R^{21}$ represents a single bond, or a linear, branched, or cyclic hydrocarbon group having 1 to 10 carbon atoms which optionally includes an ester group or an ether group. $R^{18}$ represents a single bond, a linear, branched, or cyclic alkanediyl group having 1 to 20 carbon atoms and being substituted or unsubstituted, a substituted or unsubstituted alkenylene group having 2 to 20 carbon atoms, a substituted or unsubstituted arylene group having 6 to 10 carbon atoms, or a substituted or unsubstituted aralkylene group. $R^{19}$ represents a hydrogen atom, a linear, branched, or cyclic alkyl group having 1 to 20 carbon atoms and being substituted or unsubstituted, a substituted or unsubstituted alkenyl group having 2 to 20 carbon atoms, a substituted or unsubstituted aryl group having 6 to 10 carbon atoms, or a substituted or unsubstituted aralkyl group. Or $R^{18}$ and $R^{19}$ bond to each other to form a cyclic structure having 3 to 20 carbon atoms together with a nitrogen atom bonded to $R^{18}$ and $R^{19}$. $R^{20}$ represents an acid-labile group.

DESCRIPTION OF THE EMBODIMENTS

Embodiments of the present invention provide the following radiation-sensitive resin composition, resist pattern-forming method, and polymer.

[1] A radiation-sensitive resin composition including (A) a polymer that includes a repeating unit (I) shown by a general formula (1), and includes a fluorine atom in its molecule, (B) a polymer that includes an acid-labile group, and is insoluble or scarcely soluble in an alkali (excluding a polymer that includes the repeating unit (I) shown by the general formula (1)), and (C) a radiation-sensitive acid generator,

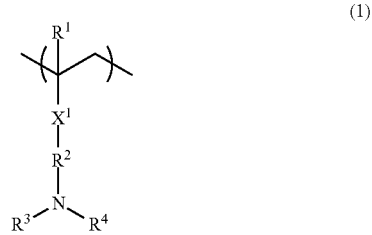

(1)

wherein $R^1$ represents a hydrogen atom, a methyl group, or a trifluoromethyl group, $X^1$ represents a single bond, a group shown by —O—$R^5$—, a group shown by —C(=O)—O—$R^5$—, a group shown by —C(=O)—NH—$R^5$—, a linear or branched alkanediyl group having 1 to 4 carbon atoms, or a phenylene group, $R^5$ represents a linear, branched, or cyclic hydrocarbon group having 1 to 10 carbon atoms that may include an ester group or an ether group, or a single bond, $R^2$ represents a single bond, a substituted or unsubstituted linear, branched, or cyclic alkanediyl group having 1 to 20 carbon atoms, a substituted or unsubstituted alkenylene group having 2 to 20 carbon atoms, a substituted or unsubstituted arylene group having 6 to 10 carbon atoms, or a substituted or unsubstituted aralkylene group, $R^3$ represents a hydrogen atom, a substituted or unsubstituted linear, branched, or cyclic alkyl group having 1 to 20 carbon atoms, a substituted or unsubstituted alkenyl group having 2 to 20 carbon atoms, a substituted or unsubstituted aryl group having 6 to 10 carbon atoms, or a substituted or unsubstituted aralkyl group, provided that $R^2$ and $R^3$ may bond to each other to form a cyclic structure having 3 to 20 carbon atoms together with a nitrogen atom bonded to $R^2$ and $R^3$, and $R^4$ represents an acid-labile group.

[2] The radiation-sensitive resin composition according to [1], wherein the repeating unit (I) shown by the general formula (1) is a repeating unit shown by a general formula (1-1),

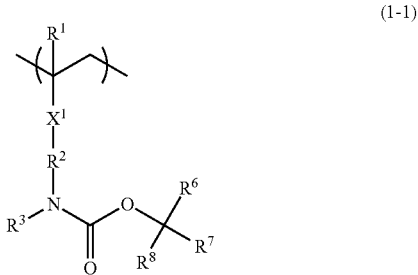

(1-1)

wherein $R^1$ represents a hydrogen atom, a methyl group, or a trifluoromethyl group, $X^1$ represents a single bond, a group shown by —O—$R^5$—, a group shown by —C(=O)—O—$R^5$—, a group shown by —C(=O)—NH—$R^5$—, a linear or branched alkanediyl group having 1 to 4 carbon atoms, or a phenylene group, $R^5$ represents a linear, branched, or cyclic hydrocarbon group having 1 to 10 carbon atoms that may include an ester group or an ether group, or a single bond, $R^2$ represents a single bond, a substituted or unsubstituted linear, branched, or cyclic alkanediyl group having 1 to 20 carbon atoms, a substituted or unsubstituted alkenylene group having 2 to 20 carbon atoms, a substituted or unsubstituted arylene group having 6 to 10 carbon atoms, or a substituted or unsubstituted aralkylene group, $R^3$ represents a hydrogen atom, a substituted or unsubstituted linear, branched, or cyclic alkyl group having 1 to 20 carbon atoms, a substituted or unsubstituted alkenyl group having 2 to 20 carbon atoms, a substituted or unsubstituted aryl group having 6 to 10 carbon atoms, or a substituted or unsubstituted aralkyl group, provided that $R^2$ and $R^3$ may bond to each other to form a cyclic structure having 3 to 20 carbon atoms together with a nitrogen atom bonded to $R^2$ and $R^3$, and $R^6$, $R^7$, and $R^8$ independently represent a linear or branched alkyl group having 1 to 4 carbon atoms, a monovalent alicyclic hydrocarbon group having 4 to 20 carbon atoms, an aryl group, or an aralkyl group, or $R^6$ and $R^7$ bond to each other to form an alicyclic hydrocarbon group having 4 to 20 carbon atoms together with a carbon atom bonded to $R^6$ and $R^7$, and $R^8$ represents a linear or branched alkyl group having 1 to 4 carbon atoms, a monovalent alicyclic hydrocarbon group having 4 to 20 carbon atoms, an aryl group, or an aralkyl group.

[3] The radiation-sensitive resin composition according to [1] or [2], wherein the polymer (A) further includes at least one of a repeating unit shown by a general formula (2-1) and a repeating unit shown by a general formula (2-2),

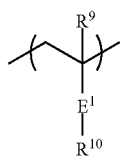

(2-1)

wherein $R^9$ represents a hydrogen atom, a methyl group, or a trifluoromethyl group, $E^1$ represents a linking group, and $R^{10}$ represents a linear or branched alkyl group having 1 to 6 carbon atoms that is substituted with at least one fluorine atom, a monovalent alicyclic hydrocarbon group having 4 to 20 carbon atoms that is substituted with at least one fluorine atom, or a derivative thereof,

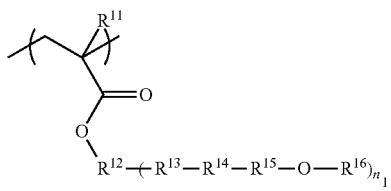

(2-2)

wherein $R^{11}$ represents a hydrogen atom, a methyl group, or a trifluoromethyl group, $R^{12}$ represents a single bond or a linear, branched, or cyclic saturated or unsaturated ($n_1$+1)-valent hydrocarbon group having 1 to 10 carbon atoms, $R^{13}$ represents a single bond or a linear, branched, or cyclic saturated or unsaturated divalent hydrocarbon group having 1 to 20 carbon atoms, $R^{14}$ represents a methylene group that is substituted with a fluorine atom, or a linear or branched fluoroalkanediyl group having 2 to 20 carbon atoms, $R^{15}$ represents a single bond or —CO—, $R^{16}$ represents a hydrogen atom or an acid-labile group, and $n_1$ is an integer from 1 to 3.

[4] The radiation-sensitive resin composition according to any of [1] to [3], wherein the polymer (A) has a fluorine atom content of 5 mass % or more based on the total amount of polymer (A), and the polymer (B) has a fluorine atom content of less than 5 mass % based on the total amount of polymer (B).

[5] The radiation-sensitive resin composition according to any of [1] to [4], the radiation-sensitive resin composition including the polymer (A) in an amount of 0.1 to 20 parts by mass based on 100 parts by mass of the polymer (B).

[6] The radiation-sensitive resin composition according to any of [1] to [5], the radiation-sensitive resin composition being used for liquid immersion lithography.

[7] A resist pattern-forming method including step (1) forming a resist film on a substrate using the radiation-sensitive resin composition according to any of [1] to [6], step (2) exposing the resist film, and step (3) developing the exposed resist film to form a resist pattern.

[8] The resist pattern-forming method according to [7], wherein an immersion liquid is provided over the resin film formed in step (1), then, the resist film is exposed via the immersion liquid.

[9] A polymer including a repeating unit (3) shown by a general formula (3), and comprising a fluorine atom in its molecule,

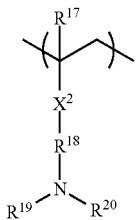

(3)

wherein $R^{17}$ represents a hydrogen atom, a methyl group, or a trifluoromethyl group, $X^2$ represents a single bond, a group shown by —O—$R^{21}$—, a group shown by —C(=O)—O—$R^{21}$—, a group shown by —C(=O)—NH—$R^{21}$—, a linear or branched alkanediyl group having 1 to 4 carbon atoms, or a phenylene group, $R^{21}$ represents a linear, branched, or cyclic hydrocarbon group having 1 to 10 carbon atoms that may include an ester group or an ether group, or a single bond, $R^{18}$ represents a single bond, a substituted or unsubstituted linear, branched, or cyclic alkanediyl group having 1 to 20 carbon atoms, a substituted or unsubstituted alkenylene group having 2 to 20 carbon atoms, a substituted or unsubstituted arylene group having 6 to 10 carbon atoms, or a substituted or unsubstituted aralkylene group, $R^{19}$ represents a hydrogen atom, a substituted or unsubstituted linear, branched, or cyclic alkyl group having 1 to 20 carbon atoms, a substituted or unsubstituted alkenyl group having 2 to 20 carbon atoms, a substituted or unsubstituted aryl group having 6 to 10 carbon atoms, or a substituted or unsubstituted aralkyl group, provided that $R^{18}$ and $R^{19}$ may bond to each other to form a cyclic structure having 3 to 20 carbon atoms together with a nitrogen atom bonded to $R^{18}$ and $R^{19}$, and $R^{20}$ represents an acid-labile group.

[10] The polymer according to [9], wherein the repeating unit (3) shown by the general formula (3) is a repeating unit shown by a general formula (3-1),

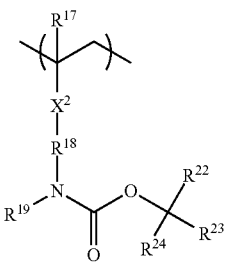

(3-1)

wherein $R^{17}$ represents a hydrogen atom, a methyl group, or a trifluoromethyl group, $X^2$ represents a single bond, a group shown by —O—$R^{21}$—, a group shown by —C(=O)—O—$R^{21}$—, a group shown by —C(=O)—NH—$R^{21}$—, a linear or branched alkanediyl group having 1 to 4 carbon atoms, or a phenylene group, $R^{21}$ represents a linear, branched, or cyclic hydrocarbon group having 1 to 10 carbon atoms that may include an ester group or an ether group, or a single bond, $R^{18}$ represents a single bond, a substituted or unsubstituted linear, branched, or cyclic alkanediyl group having 1 to 20 carbon atoms, a substituted or unsubstituted alkenylene group having 2 to 20 carbon atoms, a substituted or unsubstituted arylene group having 6 to 10 carbon atoms, or a substituted or unsubstituted aralkylene group, $R^{19}$ represents a hydrogen atom, a substituted or unsubstituted linear, branched, or cyclic alkyl group having 1 to 20 carbon atoms, a substituted or unsubstituted alkenyl group having 2 to 20 carbon atoms, a substituted or unsubstituted aryl group having 6 to 10 carbon atoms, or a substituted or unsubstituted aralkyl group, provided that $R^{18}$ and $R^{19}$ may bond to each other to form a cyclic structure having 3 to 20 carbon atoms together with a nitrogen atom bonded to $R^{18}$ and $R^{19}$, and $R^{22}$, $R^{23}$, and $R^{24}$ independently represent a linear or branched alkyl group having 1 to 4 carbon atoms, a monovalent alicyclic hydrocarbon group having 4 to 20 carbon atoms, an aryl group, or an aralkyl group, or $R^{22}$ and $R^{23}$ bond to each other to form an alicyclic hydrocarbon group having 4 to 20 carbon atoms together with a carbon atom bonded to $R^{22}$ and $R^{23}$, and $R^{24}$ represents a linear or branched alkyl group having 1 to 4 carbon atoms, a monovalent alicyclic hydrocarbon group having 4 to 20 carbon atoms, an aryl group, or an aralkyl group.

[11] The polymer according to [9] or [10], further comprising at least one of a repeating unit shown by a general formula (4-1) and a repeating unit shown by a general formula (4-2),

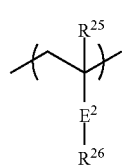

(4-1)

wherein $R^{25}$ represents a hydrogen atom, a methyl group, or a trifluoromethyl group, $E^2$ represents a linking group, and $R^{26}$ represents a linear or branched alkyl group having 1 to 6 carbon atoms that is substituted with at least one fluorine atom, a monovalent alicyclic hydrocarbon group having 4 to 20 carbon atoms that is substituted with at least one fluorine atom, or a derivative thereof,

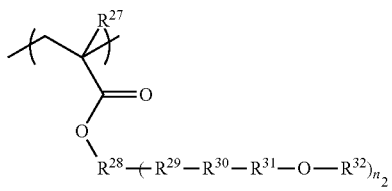

(4-2)

wherein $R^{27}$ represents a hydrogen atom, a methyl group, or a trifluoromethyl group, $R^{28}$ represents a single bond or a linear, branched, or cyclic saturated or unsaturated ($n_2$+1)-valent hydrocarbon group having 1 to 10 carbon atoms, $R^{29}$ represents a single bond or a linear, branched, or cyclic saturated or unsaturated divalent hydrocarbon group having 1 to 20 carbon atoms, $R^{30}$ represents a methylene group that is substituted with a fluorine atom, or a linear or branched fluoroalkanediyl group having 2 to 20 carbon atoms, $R^{31}$ represents a single bond or —CO—, $R^{32}$ represents a hydrogen atom or an acid-labile group, and $n_2$ is an integer from 1 to 3.

The radiation-sensitive resin composition can form a resist pattern having an excellent cross-sectional shape.

The resist pattern-forming method can form a resist pattern having an excellent cross-sectional shape.

The polymer may be used as a material for a radiation-sensitive resin composition that can form a resist pattern having an excellent cross-sectional shape.

Exemplary embodiments of the invention are described below. Note that the invention is not limited to the following exemplary embodiments. Specifically, various modifications, improvements, and the like may be made of the following exemplary embodiments without departing from the scope of the invention based on the common knowledge of a person having ordinary skill in the art.

[1] Radiation-Sensitive Resin Composition

A radiation-sensitive resin composition according to the embodiment of the invention includes (A) a polymer that includes a repeating unit (I) shown by the general formula (1), and includes a fluorine atom in its molecule (hereinafter may be referred to as "polymer (A)"), (B) a polymer that includes an acid-labile group, and is insoluble or scarcely soluble in an alkali (excluding a polymer that includes the repeating unit (I) shown by the general formula (1)) (hereinafter may be referred to as "polymer (B)"), and (C) a radiation-sensitive acid generator (hereinafter may be referred to as "acid generator (C)").

When forming a resist film using the radiation-sensitive resin composition that includes the polymer (A) that includes a fluorine moiety in the structure, the polymer (A) tends to be highly distributed in the surface of the resist film due to the oil repellency of the polymer (A). Specifically, the polymer (A) is unevenly distributed in the surface layer of the resist film.

Since the amino group included in the polymer includes the acid-labile group ($R^4$ in the general formula (1)), the acid-labile group dissociates from the amino group in the exposed area, and the amino group functions as a base. On the other hand, the acid-labile group does not dissociate in the non-exposed area (i.e., the polymer (A) does not function as a base). Therefore, a difference in base concentration occurs between the exposed area and the non-exposed area (i.e., the contrast in base concentration between the exposed area and the non-exposed area increases). This makes it possible to control the acid concentration in the surface area of the resist film, and form a resist pattern having an excellent cross-sectional shape.

The radiation-sensitive resin composition according to the embodiment of the invention is preferably used for liquid immersion lithography since elution during liquid immersion lithography can be suppressed due to the polymer (A) that includes a fluorine atom, and a high-speed scan can be performed due to a good balance in contact angles.

[1-1] Polymer (A)

The polymer (A) includes the repeating unit (I) shown by the general formula (1) (hereinafter may be simply referred to as "repeating unit (I)"), and includes a fluorine atom in its molecule. The combination of the polymer (A) and the polymer (B) exhibits excellent effects. Specifically, since the polymer (A) and the polymer (B) exhibit poor compatibility, the polymer (A) is unevenly distributed in the surface layer of the resist film. This makes it possible to control the acid concentration in the surface area of the resist film. Moreover, since the polymer (A) includes an amino group and an acid-labile group, the contrast in acid concentration increases.

It is preferable that the fluorine atom content of the polymer (A) be higher than that of the polymer (B) in order to efficiently cause the polymer (A) to be unevenly distributed in the surface layer of the resist film (i.e., fluorine atom content of the polymer (A)>fluorine atom content of the polymer (B)). More specifically, it is preferable that the polymer (A) have a fluorine atom content of 5 mass % or more based on the total amount of the polymer (A) (i.e., the polymer (A) have a fluorine atom content of 5 mass % or more based on the total atoms (=100 mass %) included in the polymer (A)), and the polymer (B) have a fluorine atom content of less than 5 mass % based on the total amount of the polymer (B). The fluorine atom content of each polymer may be determined by $^{13}$C-NMR analysis.

[1-1-1] Repeating Unit (I)

The polymer (A) exhibits the effects in combination with the polymer (B). In particular, the repeating unit (I) ensures that the nitrogen-containing compound (i.e., polymer (A)) that includes an acid-labile group functions as an acid diffusion controller that suppresses diffusion of an acid. Specifically, the polymer (A) (i.e., the repeating unit (I) included in the polymer (A)) can control the acid concentration, advantageously.

$R^1$ in the general formula (1) preferably represents a hydrogen atom or a methyl group since the polymer (A) can be easily synthesized. $X^1$ preferably represents the group shown by —C(=O)—O—$R^5$— or the group shown by —C(=O)—NH—$R^5$—. Note that $R^5$ represents a linear, branched, or cyclic hydrocarbon group having 1 to 10 carbon atoms that may include an ester group or an ether group, or a single bond.

The substituted or unsubstituted linear, branched, or cyclic alkanediyl group having 1 to 20 carbon atoms represented by $R^2$ is preferably an alkanediyl group having 2 or more carbon atoms. Specific examples of the alkanediyl group having 2 or more carbon atoms include an ethylene group, an n-propylene group, an i-propylene group, an n-butylene group, an n-pentylene group, an n-hexylene group, an n-heptylene group, an n-octylene group, an n-nonylene group, an n-decylene group, and the like. Examples of the cyclic alkanediyl group include a cyclobutylene group, a cyclopentylene group, a cyclohexylene group, a cyclooctylene group, a norbornylene group, a tricyclodecylene group, a tetracyclododecylene group, an adamantylene group, and the like.

The term "aralkyl group" refers to a lower alkyl group that is substituted with an aryl group. Examples of the aralkyl group represented by $R^2$ and $R^3$ include a benzyl group, a phenylethyl group, a phenylpropyl group, a naphthylmethyl group, a naphthylethyl group, and the like.

The substituted or unsubstituted linear or branched alkyl group having 1 to 20 carbon atoms represented by $R^3$ is preferably an alkyl group having 2 or more carbon atoms. Specific examples of the alkyl group having 2 or more carbon atoms include an ethyl group, an n-propyl group, an i-propyl group, an n-butyl group, an n-pentyl group, an n-hexyl group, an n-heptyl group, an n-octyl group, an n-nonyl group, an n-decyl group, and the like. Examples of the cyclic alkyl group include a cyclobutyl group, a cyclopentyl group, a cyclohexyl group, a cyclooctyl group, a norbornyl group, a tricyclodecyl group, a tetracyclododecyl group, an adamantyl group, and the like. Examples of the aryl group having 6 to 10 carbon atoms include a phenyl group, a naphtyl group, and the like.

Examples of the cyclic structure formed by $R^2$ and $R^3$ together with the nitrogen atom bonded to $R^2$ and $R^3$ include a pyrrole structure, an imidazole structure, a pyrazole structure, a pyridine structure, a pyridazine structure, a pyrimidine structure, a pyrazine structure, a piperidine structure, a pyrrolidine structure, a piperazine structure, a morpholine structure, and the like.

Examples of the acid-labile group represented by $R^4$ in the general formula (1) include a group shown by the following general formula (5) (hereinafter may be referred to as "acid-labile group (I)"), a group shown by the following general formula (6) (hereinafter may be referred to as "acid-labile group (II)"), and the like.

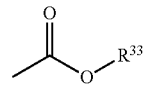

(5)

wherein $R^{33}$ includes a hydrogen atom, a linear or branched alkyl group having 1 to 19 carbon atoms, an alicyclic hydrocarbon group having 4 to 20 carbon atoms, an aryl group having 6 to 19 carbon atoms, or an aralkyl group, provided that these groups may be substituted with at least one group or atom selected from the group consisting of a hydroxyl group, a carboxyl group, a carbonyl group, a nitro group, an ether group, an ester group, an amino group, a silyl group, a halogen atom, and thiophene.

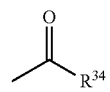

(6)

wherein $R^{34}$ includes a hydrogen atom, a linear or branched alkyl group having 1 to 19 carbon atoms, an alicyclic hydrocarbon group having 4 to 20 carbon atoms, an aryl group having 6 to 19 carbon atoms, or an aralkyl group, provided that these groups may be substituted with at least one group or atom selected from the group consisting of a hydroxyl group, a carboxyl group, a carbonyl group, a nitro group, an ether group, an ester group, an amino group, a silyl group, a halogen atom, and thiophene.

It is preferable that $R^{33}$ in the acid-labile group (I) includes an alkyl group or an aralkyl group, and more preferably a methyl group, a tert-butyl group, a tert-amyl group, a benzyl group, or a cinnamyl group. It is preferable that $R^{34}$ in the acid-labile group (II) includes a hydrogen atom, an alkyl group, or an aryl group, and more preferably a formyl group, an acetyl group, a trichloroacetyl group, a trifluoroacetyl group, or a benzoyl group.

The repeating unit shown by the general formula (1-1) is preferable as the repeating unit (I) shown by the general formula (1) since the acid-labile group sufficiently dissociates.

Examples of the monovalent alicyclic hydrocarbon group having 4 to 20 carbon atoms represented by $R^6$, $R^7$, and $R^8$ in the general formula (1-1) include a cyclobutyl group, a cyclopentyl group, a cyclohexyl group, a cyclooctyl group, a norbornyl group, a tricyclodecyl group, a tetracyclododecyl group, an adamantyl group, and the like.

Examples of the aryl group include a phenyl group, a naphthyl group, and the like. Examples of the aralkyl group include a benzyl group, a phenylethyl group, a phenylpropyl group, a naphthylmethyl group, a naphthylethyl group, and the like.

Examples of the alicyclic hydrocarbon group having 4 to 20 carbon atoms formed by $R^6$ and $R^7$ together with the carbon atom bonded to $R^6$ and $R^7$ include a cyclobutyl group, a cyclopentyl group, a cyclohexyl group, a cyclooctyl group, a norbornyl group, a tricyclodecyl group, a tetracyclododecyl group, an adamantyl group, and the like.

Specific examples of the repeating unit (I) shown by the general formula (1) include repeating units shown by the following general formulas (1-1a) to (1-1i), and the like.
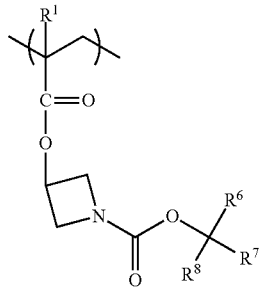
(1-1a)
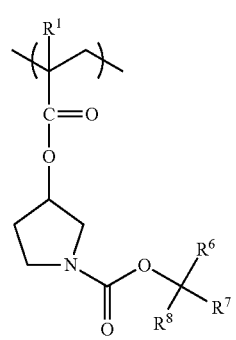
(1-1b)
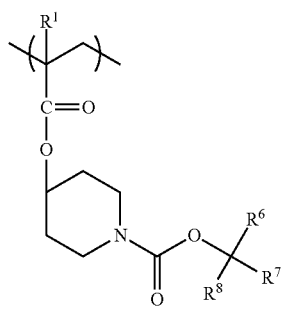
(1-1c)
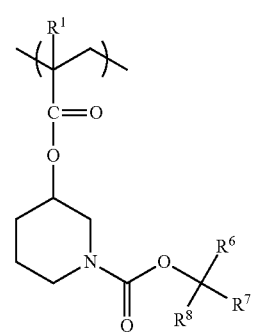
(1-1d)
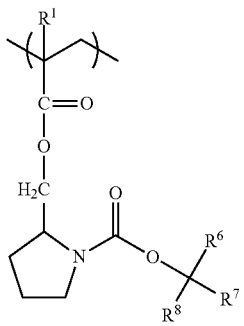
(1-1e)
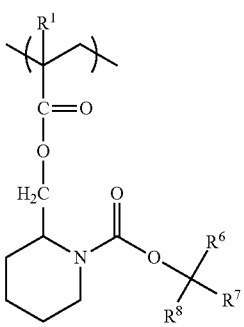
(1-1f)
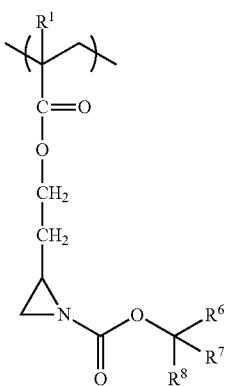
(1-1g)
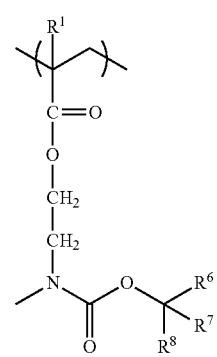
(1-1h)

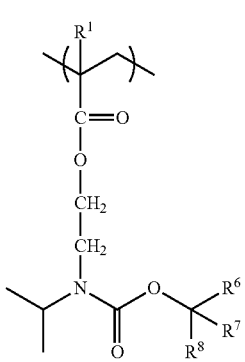

wherein $R^1$ represents a hydrogen atom, a methyl group, or a trifluoromethyl group, $R^6$, $R^7$, and $R^8$ independently represent a linear or branched alkyl group having 1 to 4 carbon atoms, a monovalent alicyclic hydrocarbon group having 4 to 20 carbon atoms, an aryl group, or an aralkyl group, or $R^6$ and $R^7$ bond to each other to form an alicyclic hydrocarbon group having 4 to 20 carbon atoms together with a carbon atom bonded to $R^6$ and $R^7$, and $R^8$ represents a linear or branched alkyl group having 1 to 4 carbon atoms, a monovalent alicyclic hydrocarbon group having 4 to 20 carbon atoms, an aryl group, or an aralkyl group. It is preferable that $R^6$, $R^7$, and $R^8$ represent a linear alkyl group having 1 to 4 carbon atoms since the acid-labile group easily dissociate due to an acid.

The content of the repeating unit (I) in the polymer (A) is preferably 0.01 to 50 mol %, more preferably 0.1 to 30 mol %, and particularly preferably 0.1 to 20 mol %, based on the total repeating units (=100 mol %) included in the polymer (A). If the content of the repeating unit (I) is within the above range, it is possible to moderately control the acid concentration in the surface area of the resist film by being unevenly distributed in the surface layer of the resist film, and form a resist pattern having an excellent cross-sectional shape.

[1-1-2] Repeating Unit (II)

The polymer (A) is not particularly limited as long as the polymer (A) includes the repeating unit (I), and includes a fluorine atom in its molecule. It is preferable that the polymer (A) include a repeating unit that includes a fluorine atom (hereinafter may be referred to as "repeating unit (II)"). In this case, the polymer (A) is unevenly distributed in the surface layer of the resist film, so that the acid concentration in the surface layer of the resist film can be controlled.

Specific examples of the repeating unit (II) include a repeating unit shown by the following general formula (2-1) (hereinafter may be referred to as "repeating unit (2-1)"), a repeating unit shown by the following general formula (2-2) (hereinafter may be referred to as "repeating unit (2-2)"), and the like. It is preferable that the polymer (A) include at least one of the repeating unit (2-1) and the repeating unit (2-2) since the acid concentration in the surface layer of the resist film can be advantageously controlled.

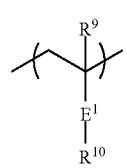

(2-1)

wherein $R^9$ represents a hydrogen atom, a methyl group, or a trifluoromethyl group, $E^1$ represents a linking group, and $R^{10}$ represents a linear or branched alkyl group having 1 to 6 carbon atoms that is substituted with at least one fluorine atom, a monovalent alicyclic hydrocarbon group having 4 to 20 carbon atoms that is substituted with at least one fluorine atom, or a derivative thereof

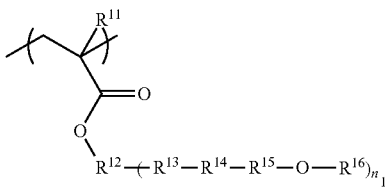

(2-2)

wherein $R^{11}$ represents a hydrogen atom, a methyl group, or a trifluoromethyl group, $R^{12}$ represents a single bond or a linear, branched, or cyclic saturated or unsaturated $(n_1+1)$-valent hydrocarbon group having 1 to 10 carbon atoms, $R^{13}$ represents a single bond or a linear, branched, or cyclic saturated or unsaturated divalent hydrocarbon group having 1 to 20 carbon atoms, $R^{14}$ represents a methylene group that is substituted with a fluorine atom, or a linear or branched fluoroalkanediyl group having 2 to 20 carbon atoms, $R^{15}$ represents a single bond or —CO—, $R^{16}$ represents a hydrogen atom or an acid-labile group, and $n_1$ is an integer from 1 to 3.

Examples of the linking group represented by $E^1$ in the general formula (2-1) include a single bond, an oxygen atom, a sulfur atom, a carbonyloxy group, an oxycarbonyl group, an amide group, a sulfonylamide group, a urethane group, and the like.

Examples of the linear or branched alkyl group having 1 to 6 carbon atoms that is substituted with at least one fluorine atom represented by $R^{10}$ in the general formula (2-1) include a group obtained by partial fluorination of a linear or branched alkyl group (methyl group, ethyl group, 1-propyl group, 2-propyl group, 1-butyl group, 2-butyl group, 2-(2-methylpropyl) group, 1-pentyl group, 2-pentyl group, 3-pentyl group, 1-(2-methylbutyl) group, 1-(3-methylbutyl) group, 2-(2-methylbutyl) group, 2-(3-methylbutyl) group, neopentyl group, 1-hexyl group, 2-hexyl group, 3-hexyl group, 1-(2-methylpentyl) group, 1-(3-methylpentyl) group, 1-(4-methylpentyl) group, 2-(2-methylpentyl) group, 2-(3-methylpentyl) group, 2-(4-methylpentyl) group, 3-(2-methylpentyl) group, or 3-(3-methylpentyl) group), a perfluoroalkyl group, and the like.

Examples of the monovalent alicyclic hydrocarbon group having 4 to 20 carbon atoms that is substituted with at least one fluorine atom, or a derivative thereof, include a group obtained by partial fluorination of an alicyclic alkyl group (e.g., cyclopentyl group, cyclopentylmethyl group, 1-(1-cyclopentylethyl) group, 1-(2-cyclopentylethyl) group, cyclohexyl group, cyclohexylmethyl group, 1-(1-cyclohexylethyl) group, 1-(2-cyclohexylethyl) group, cycloheptyl group, cycloheptylmethyl group, 1-(1-cycloheptylethyl) group, 1-(2-cycloheptylethyl) group, or 2-norbornyl group), a perfluoroalkyl group, and the like.

Examples of a monomer that produces the repeating unit (2-1) include trifluoromethyl(meth)acrylate, 2,2,2-trifluoroethyl(meth)acrylate, perfluoroethyl(meth)acrylate, perfluoro-n-propyl(meth)acrylate, perfluoro-i-propyl(meth)acrylate, perfluoro-n-butyl(meth)acrylate, perfluoro-1-butyl (meth)acrylate, perfluoro t-butyl(meth)acrylate, 2-(1,1,1,3,3,3-hexafluoropropyl) (meth)acrylate, 1-(2,2,3,3,4,4,5,5-octafluoropentyl)(meth)acrylate, perfluorocyclohexylmethyl (meth)acrylate, 1-(2,2,3,3,3-pentafluoropropyl)(meth) acrylate, 1-(3,3,4,4,5,5,6,6,7,7,8,8,9,9,10,10,10-heptadecafluorodecyl)(meth)acrylate, 1-(5-trifluoromethyl-3,3,4,4,5,6,6,6-octafluorohexyl)(meth)acrylate, and the like.

Examples of the linear or branched saturated or unsaturated $(n_1+1)$-valent hydrocarbon group having 1 to 10 carbon atoms represented by $R^{12}$ in the general formula (2-2) include divalent hydrocarbon groups derived from a linear or branched alkyl group having 1 to 10 carbon atoms (e.g., methyl group, ethyl group, n-propyl group, i-propyl group, n-butyl group, 2-methylpropyl group, 1-methylpropyl group, t-butyl group, pentyl group, isopentyl group, neopentyl group, hexyl group, heptyl group, octyl group, nonyl group, or decyl group), and the like.

Examples of the cyclic saturated or unsaturated $(n_1+1)$-valent hydrocarbon group include a group derived from an alicyclic hydrocarbon having 3 to 10 carbon atoms or an aromatic hydrocarbon, and the like. Examples of the alicyclic hydrocarbon include cycloalkanes such as cyclobutane, cyclopentane, cyclohexane, bicyclo[2.2.1]heptane, bicyclo[2.2.2]octane, tricyclo[5.2.1.0$^{2,6}$]decane, and tricyclo[3.3.1.1$^{3,7}$]decane, and the like. Examples of the aromatic hydrocarbon include benzene, naphthalene, and the like.

Examples of the linear or branched saturated or unsaturated divalent hydrocarbon group having 1 to 20 carbon atoms represented by $R^{13}$ in the general formula (2-2) include a divalent hydrocarbon group derived from a linear or branched alkyl group having 1 to 20 carbon atoms (e.g., methyl group, ethyl group, n-propyl group, i-propyl group, n-butyl group, 2-methylpropyl group, 1-methylpropyl group, t-butyl group, pentyl group, isopentyl group, neopentyl group, hexyl group, heptyl group, octyl group, nonyl group, and decyl group), and the like.

Examples of the cyclic saturated or unsaturated divalent hydrocarbon group include a group derived from an alicyclic hydrocarbon having 3 to 20 carbon atoms or an aromatic hydrocarbon, and the like. Specific examples of the alicyclic hydrocarbon include cycloalkanes such as cyclobutane, cyclopentane, cyclohexane, bicyclo[2.2.1]heptane, bicyclo[2.2.2]octane, tricyclo[5.2.1.0$^{2,6}$]decane, tricyclo[3.3.1.1$^{3,7}$]decane, and tetracyclo[6.2.1.1$^{3,6}$.0$^{2,7}$]dodecane, and the like. Specific examples of the aromatic hydrocarbon include benzene, naphthalene, and the like.

The hydrocarbon group represented by $R^{13}$ in the general formula (2-2) may be a hydrocarbon group in which at least one hydrogen atom is substituted with at least one of a linear, branched, or cyclic alkyl group having 1 to 12 carbon atoms (e.g., methyl group, ethyl group, n-propyl group, i-propyl group, n-butyl group, 2-methylpropyl group, 1-methylpropyl group, or t-butyl group), a hydroxyl group, a cyano group, a hydroxyalkyl group having 1 to 10 carbon atoms, a carboxyl group, an oxygen atom, and the like.

When $n_1$ in the general formula (2-2) is 2 or 3, a plurality of $R^{13}$ may be either the same or different.

The acid-labile group represented by $R^{16}$ in the general formula (2-2) refers to a group that substitutes a hydrogen atom of an acidic functional group such as a hydroxyl group, a carboxyl group, or a sulfonic acid group, and dissociates in the presence of an acid. Specific examples of the acid-labile group include a t-butoxycarbonyl group, a tetrahydropyranyl group, a tetrahydrofuranyl group, a (thiotetrahydropyranylsulfanyl)methyl group, a (thiotetrahydrofuranylsulfanyl)methyl group, an alkoxy-substituted methyl group, an alkylsulfanyl-substituted methyl group, and the like. Examples of the alkoxy group (substituent) of the alkoxy-substituted methyl group include alkoxy groups having 1 to 4 carbon atoms. Examples of the alkyl group (substituent) of the alkylsulfanyl-substituted methyl group include alkyl groups having 1 to 4 carbon atoms. The acid-labile group may be a group shown by a general formula (7-1a) (shown below).

Examples of the methylene group that is substituted with a fluorine atom or the linear or branched fluoroalkanediyl group having 2 to 20 carbon atoms represented by $R^{14}$ in the general formula (2-2) include the groups shown by the following formulas (X-1) to (X-8), and the like.

(X-1)

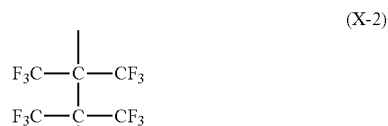

(X-2)

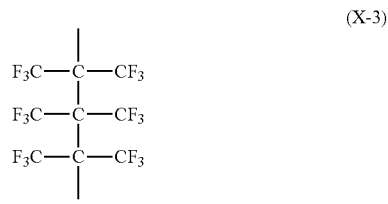

(X-3)

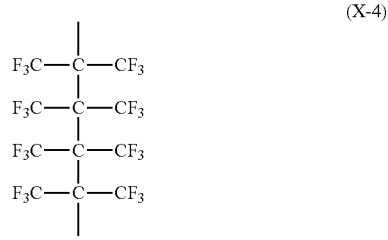

(X-4)

(X-5)

(X-6)

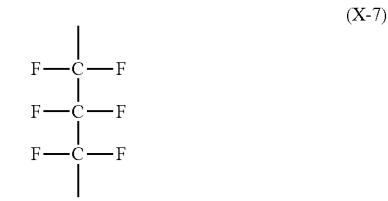

(X-7)

-continued (X-8)
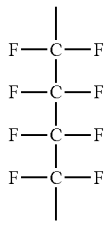

Examples of the repeating unit (2-2) include repeating units shown by the following general formulas (2-2-1) to (2-2-3), and the like.

(2-2-1)
(2-2-2)
(2-2-3)

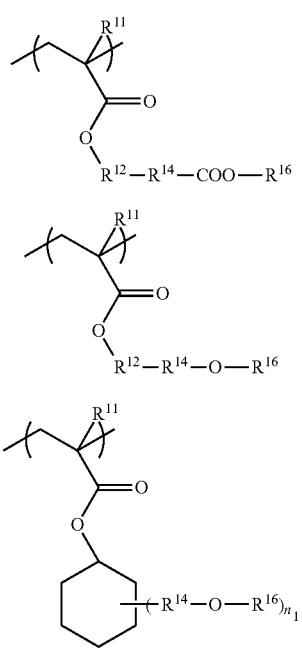

wherein $R^{11}$ represents a hydrogen atom, a methyl group, or a trifluoromethyl group, $R^{14}$ represents a methylene group that is substituted with a fluorine atom, or a linear or branched fluoroalkanediyl group having 2 to 20 carbon atoms, $R^{12}$ represents a single bond or a linear, branched, or cyclic saturated or unsaturated divalent hydrocarbon group having 1 to 20 carbon atoms, $R^{16}$ represents a hydrogen atom or an acid-labile group, and $n_1$ is an integer from 1 to 3.

Examples of a monomer that produces the repeating unit (2-2) include compounds shown by the following formulas (T-1) to (T-6).

(T-1)
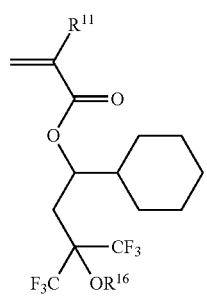

(T-2)
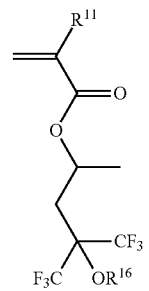

(T-3)
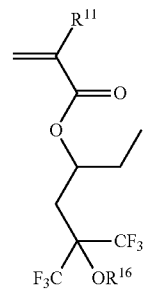

(T-4)
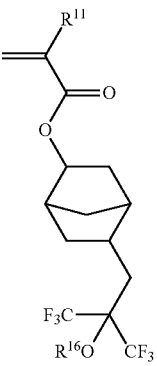

(T-5)
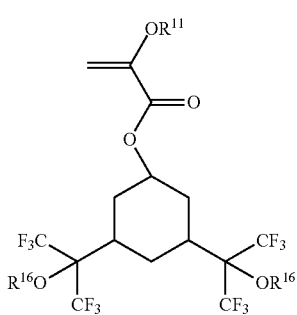

(T-6)
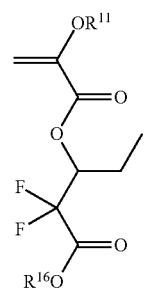

wherein $R^{11}$ represents a hydrogen atom, a methyl group, or a trifluoromethyl group, and $R^{16}$ represents a hydrogen atom or an acid-labile group.

The content of the repeating unit (II) in the polymer (A) is preferably 20 to 90 mol %, more preferably 20 to 80 mol %, and particularly preferably 20 to 70 mol %, based on the total repeating units (=100 mol %) included in the polymer (A). If the content of the repeating unit (II) is within the above range, water repellency can be achieved after application while ensuring developability.

[1-1-3] Additional Repeating Unit

The polymer (A) may include an additional repeating unit other than the repeating units (I) and (II). Examples of the additional repeating unit include a repeating unit that includes an acid-labile group (hereinafter may be referred to as "repeating unit (III)"), a repeating unit that includes an alkali-reactive group (hereinafter may be referred to as "repeating unit (IV)"), a repeating unit that includes an alkali-soluble group (hereinafter may be referred to as "repeating unit (V)"), a repeating unit that includes an alicyclic structure (excluding a repeating unit that falls under the repeating unit (III)) (hereinafter may be referred to as "repeating unit (VI)"), a repeating unit that is derived from an aromatic compound (hereinafter may be referred to as "repeating unit (VII)"), a repeating unit other than the repeating units (I) to (VII) (hereinafter may be referred to as "repeating unit (VIII)"), and the like.

[1-1-3-1] Repeating Unit (III)

Examples of the repeating unit (III) include a repeating unit shown by the following general formula (7-1), and the like.

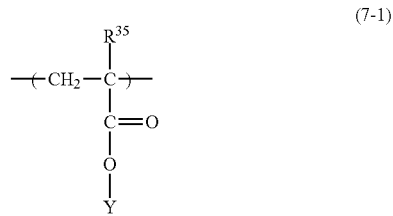

wherein $R^{35}$ represents a hydrogen atom, a methyl group, or a trifluoromethyl group, and Y represents an acid-labile group.

Y in the general formula (7-1) preferably represents a group shown by the following general formula (7-1a).

wherein $R^{51}$ represents an alkyl group having 1 to 4 carbon atoms or a monovalent alicyclic hydrocarbon group having 4 to 20 carbon atoms, and $R^{52}$ and $R^{53}$ independently represent an alkyl group having 1 to 4 carbon atoms or an alicyclic hydrocarbon group having 4 to 20 carbon atoms, or bond to each other to form a divalent alicyclic hydrocarbon group having 4 to 20 carbon atoms together with the carbon atom bonded to $R^{52}$ and $R^{53}$.

Examples of the alkyl group having 1 to 4 carbon atoms represented by $R^{51}$ to $R^{53}$ in the general formula (7-1a) include a methyl group, an ethyl group, an n-propyl group, an i-propyl group, an n-butyl group, a 2-methylpropyl group, a 1-methylpropyl group, a t-butyl group, and the like. Examples of the monovalent alicyclic hydrocarbon group having 4 to 20 carbon atoms and the divalent alicyclic hydrocarbon group having 4 to 20 carbon atoms formed by $R^{51}$ and $R^{52}$ together with the carbon atom bonded to $R^{51}$ and $R^{52}$ include a group that includes an alicyclic skeleton such as a group that includes a bridged skeleton such as an adamantane skeleton, a norbornane skeleton, a tricyclodecane skeleton, or a tetracyclododecane skeleton, a group that includes a cycloalkane skeleton such as a cyclobutane skeleton, a cyclopentane skeleton, a cyclohexane skeleton, a cycloheptane skeleton, or a cyclooctane skeleton, and a group obtained by substituting these groups with at least one linear, branched, or cyclic alkyl groups having 1 to 10 carbon atoms (e.g., methyl group, ethyl group, n-propyl group, i-propyl group, n-butyl group, 2-methylpropyl group, 1-methylpropyl group, or t-butyl group).

The repeating unit (III) preferably includes the divalent alicyclic hydrocarbon group having 4 to 20 carbon atoms formed by $R^{51}$ and $R^{52}$ in the general formula (7-1a) together with the carbon atom bonded to $R^{51}$ and $R^{52}$. The repeating unit (III) preferably includes a monocyclic hydrocarbon group as the alicyclic hydrocarbon group. When the polymer (A) includes such a repeating unit (III), the difference between the advancing contact angle and the receding contact angle of the resist film decreases, so that a problem concerning with dewatering hardly occurs. Therefore, the resist film can be used for high-speed scan exposure step.

Specific examples of a monomer that produces the repeating unit (III) include 2-methyladamantan-2-yl(meth)acrylate, 2-methyl-3-hydroxyadamantan-2-yl(meth)acrylate, 2-ethyladamantan-2-yl(meth)acrylate, 2-ethyl-3-hydroxyadamantan-2-yl(meth)acrylate, 2-n-propyladamantan-2-yl(meth)acrylate, 2-isopropyladamantan-2-yl(meth)acrylate, 2-methylbicyclo[2.2.1]hept-2-yl(meth)acrylate, 2-ethylbicyclo[2.2.1]hept-2-yl(meth)acrylate, 8-methyltricyclo[5.2.1.0$^{2,6}$]decan-8-yl(meth)acrylate, 8-ethyltricyclo[5.2.1.0$^{2,6}$]decan-8-yl(meth)acrylate, 4-methyltetracyclo[6.2.1.1$^{3,6}$.0$^{2,7}$]dodecan-4-yl(meth)acrylate, 4-ethyltetracyclo[6.2.1.1$^{3,6}$.0$^{2,7}$]dodecan-4-yl(meth)acrylate, 2-(bicyclo[2.2.1]hept-2-yl)-2-methylethyl(meth)acrylate, 2-(tricyclo[5.2.1.0$^{2,6}$]decan-8-yl)-2-methylethyl(meth)acrylate, 2-(tetracyclo[6.2.1.1$^{3,6}$.0$^{2,7}$]dodecan-4-yl)-2-methylethyl(meth)acrylate, 2-(adamantan-2-yl)-2-methylethyl(meth)acrylate, 2-(3-hydroxyadamantan-2-yl)-2-methylethyl(meth)acrylate, 1,2-dicyclohexylethyl(meth)acrylate, 1,2-di(bicyclo[2.2.1]hept-2-yl)ethyl(meth)acrylate, 1,2-di(tricyclo[5.2.1.0$^{2,6}$]decan-8-yl)ethyl(meth)acrylate, 1,2-di(tetracyclo[6.2.1.1$^{3,6}$.0$^{2,7}$]dodecan-4-yl)ethyl(meth)acrylate, 1,2-di(adamantan-2-yl)ethyl(meth)acrylate, 2-methyl-2-cyclopentyl(meth)acrylate, 2-ethyl-2-cyclopentyl(meth)acrylate, 2-methyl-2-cyclohexyl(meth)acrylate, 2-ethyl-2-cyclohexyl(meth)acrylate, and the like.

Among these, 2-methyladamantan-2-yl(meth)acrylate, 2-ethyladamantan-2-yl(meth)acrylate, 2-methylbicyclo[2.2.1]hept-2-yl(meth)acrylate, 2-ethylbicyclo[2.2.1]hept-2-yl(meth)acrylate, 2-(bicyclo[2.2.1]hept-2-yl)-2-methylethyl(meth)acrylate, 2-(adamantan-2-yl)-2-methylethyl(meth)acrylate, 2-methyl-2-cyclopentyl(meth)acrylate, 2-ethyl-2-cyclopentyl(meth)acrylate, 2-methyl-2-cyclohexyl(meth)acrylate, 2-ethyl-2-cyclohexyl(meth)acrylate, 2-ethyl-2-cyclooctyl(meth)acrylate, and the like are preferable.

The polymer (A) may include only one type of the repeating unit (III), or may include two or more types of the repeating unit (III).

[1-1-3-2] Repeating Unit (IV)

Examples of the repeating unit (IV) include a repeating unit shown by the following general formula (7-2) (hereinafter may be referred to as "repeating unit (7-2)"), and the like.

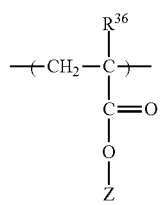
(7-2)

wherein R³⁶ represents a hydrogen atom, a methyl group, or a trifluoromethyl group, and Z represents a group that includes a lactone skeleton or a cyclic carbonate structure.

Examples of a repeating unit that includes a lactone skeleton and falls under the repeating unit (7-2) include repeating units derived from monomers shown by the following general formulas (7-2-1a) to (7-2-1f), and the like.

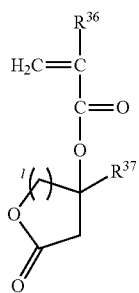
(7-2-1a)

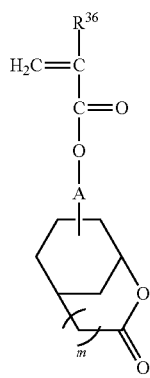
(7-2-1b)

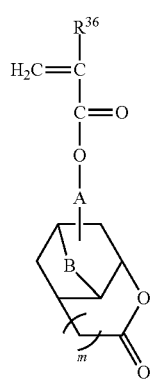
(7-2-1c)

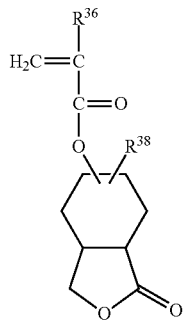
(7-2-1d)

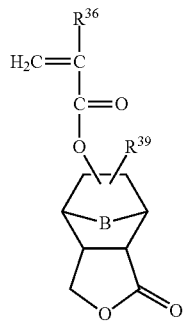
(7-2-1e)

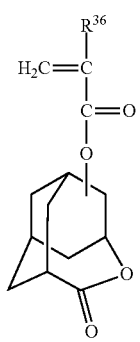
(7-2-1f)

wherein $R^{36}$ represents a hydrogen atom, a methyl group, or a trifluoromethyl group, and $R^{37}$ represents a hydrogen atom or a substituted or unsubstituted alkyl group having 1 to 4 carbon atoms, l is an integer from 1 to 3, $R^{38}$ and $R^{39}$ independently represent a hydrogen atom or a methoxy group, A represents a single bond, an ether group, an ester group, a carbonyl group, a divalent chain hydrocarbon group having 1 to 30 carbon atoms, a divalent alicyclic hydrocarbon group having 3 to 30 carbon atoms, a divalent aromatic hydrocarbon group having 6 to 30 carbon atoms, or a divalent group formed by combining arbitrary groups among these groups, m is 0 or 1, and B represents an oxygen atom or a methylene group.

Examples of a monomer that produces the repeating unit that includes a lactone skeleton include 5-oxo-4-oxa-tricyclo[4.2.1.0³,⁷]non-2-yl(meth)acrylate, 9-methoxycarbonyl-5-oxo-4-oxa-tricyclo[4.2.1.0³,⁷]non-2-yl(meth)acrylate, 5-oxo-4-oxatricyclo[5.2.1.0³,⁸]dec-2-yl(meth)acrylate, (10-methoxycarbonyl-5-oxo-4-oxatricyclo[5.2.1.0³,⁸]non-2-yl (meth)acrylate, 6-oxo-7-oxabicyclo[3.2.1]oct-2-yl(meth) acrylate, 4-methoxycarbonyl-6-oxo-7-oxabicyclo[3.2.1]oct-2-yl(meth)acrylate, 7-oxo-8-oxabicyclo[3.3.1]oct-2-yl (meth)acrylate, 4-methoxycarbonyl-7-oxo-8-oxabicyclo [3.3.1]non-2-yl(meth)acrylate, 2-oxotetrahydropyran-4-yl(meth)acrylate, 4-methyl-2-oxotetrahydropyran-4-yl(meth)acrylate, 4-ethyl-2-oxotetrahydropyran-4-yl(meth)acrylate, 4-propyl-2-oxotetrahydropyran-4-yl(meth)acrylate, 5-oxotetrahydrofuran-3-yl(meth)acrylate, 2,2-dimethyl-5-oxotetrahydrofuran-3-yl(meth)acrylate, 4,4-dimethyl-5-oxotetrahydrofuran-3-yl(meth)acrylate, 2-oxotetrahydrofuran-3-yl(meth)acrylate, 4,4-dimethyl-2-oxotetrahydrofuran-3-yl(meth)acrylate, 5,5-dimethyl-2-oxotetrahydrofuran-3-yl(meth)acrylate, 2-oxotetrahydrofuran-3-yl(meth)acrylate, 5-oxotetrahydrofuran-2-ylmethyl(meth)acrylate, 3,3-dimethyl-5-oxotetrahydrofuran-2-ylmethyl(meth)acrylate, 4,4-dimethyl-5-oxotetrahydrofuran-2-ylmethyl(meth)acrylate, and the like.

A group having a repeating unit that includes a cyclic carbonate structure of repeating unit (7-2) is an alkali-reactive group. Examples of a repeating unit that includes a cyclic carbonate structure and falls under the repeating unit (7-2) include a repeating unit shown by the following general formula (7-2-2), and the like.

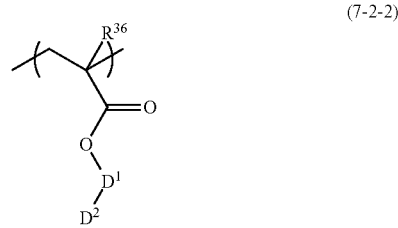

(7-2-2)

wherein $R^{36}$ represents a hydrogen atom, a methyl group, or a trifluoromethyl group, $D^1$ represents a single bond, a divalent chain hydrocarbon group having 1 to 30 carbon atoms, a divalent alicyclic hydrocarbon group having 3 to 30 carbon atoms, or a divalent aromatic hydrocarbon group having 6 to 30 carbon atoms, and $D^2$ represents a group having a structure shown by the following general formula (7-2-2-1).

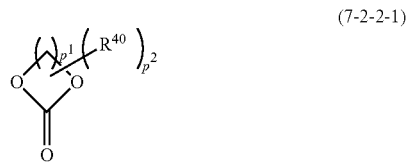

(7-2-2-1)

wherein $R^{40}$ represents (or independently represent) a hydrogen atom or a chain hydrocarbon group having 1 to 5 carbon atoms, $p^1$ is an integer from 2 to 4, and $p^2$ is 1 or 2.

Examples of the chain hydrocarbon group having 1 to 5 carbon atoms represented by $R^{40}$ in the general formula (7-2-2-1) include linear alkyl groups having 1 to 5 carbon atoms, such as a methyl group, an ethyl group, a propyl group, and a butyl group; branched alkyl groups having 3 to 5 carbon atoms, such as an isopropyl group, an isobutyl group, and a t-butyl group; and the like.

Note that the cyclic carbonate structure has a 5-membered ring structure when $p^1$ is 2 (ethylene group), has a 6-membered ring structure when $p^1$ is 3 (propylene group), and has a 7-membered ring structure when $p^1$ is 4 (butylene group).

When $D^1$ in the general formula (7-2-2) represents a single bond, the oxygen atom of (meth)acrylic acid that forms the polymer is directly bonded to the carbon atom that forms the cyclic carbonate structure.

The term "chain hydrocarbon group" represented by $D^1$ in the general formula (7-2-2) refers to a hydrocarbon group that does not include a cyclic structure in the main chain, and includes only a chain structure. The term "alicyclic hydrocarbon group" used herein refers to a hydrocarbon group that includes only an alicyclic hydrocarbon structure as a ring structure, and does not include an aromatic ring structure. Note that the alicyclic hydrocarbon group need not necessarily include only an alicyclic hydrocarbon structure, but may include a chain structure. The term "aromatic hydrocarbon group" used herein refers to a hydrocarbon group that includes an aromatic ring structure. Note that the aromatic hydrocarbon group need not necessarily include only an aromatic ring structure, but may include a chain-like structure or an alicyclic hydrocarbon structure.

Examples of the divalent chain hydrocarbon group having 1 to 30 carbon atoms represented by $D^1$ in the general formula (7-2-2) include linear alkanediyl groups such as a methylene group, an ethylene group, a 1,2-propylene group, a 1,3-propylene group, a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, and an icosylene group; branched alkanediyl groups such as a 1-methyl-1,3-propylene group, a 2-methyl-1,3-propylene group, a 2-methyl-1,2-propylene group, a 1-methyl-1,4-butylene group, a 2-methyl-1,4-butylene group, an ethylidene group, a propylidene group, and a 2-propylidene group; and the like. Examples of the trivalent chain hydrocarbon group having 1 to 30 carbon atoms include a group obtained by eliminating one hydrogen atom from a linear or branched alkanediyl group mentioned above, and the like.

Examples of the divalent alicyclic hydrocarbon group represented by $D^1$ in the general formula (7-2-2) include monocyclic cycloalkanediyl groups having 3 to 10 carbon atoms, such as a 1,3-cyclobutylene group, a 1,3-cyclopentylene group, a 1,4-cyclohexylene group, and a 1,5-cyclooctylene group; polycyclic cycloalkanediyl groups such as a 1,4-norbornylene group, a 2,5-norbornylene group, a 1,5-admantylene group, and a 2,6-admantylene group; and the like. Examples of the trivalent alicyclic hydrocarbon group include a group obtained by eliminating one hydrogen atom from a monocyclic or polycyclic cycloalkanediyl group mentioned above, and the like.

Examples of the divalent aromatic hydrocarbon group represented by $D^1$ in the general formula (7-2-2) include arylene groups such as a phenylene group, a tolylene group, a naphthylene group, a phenanthrylene group, and an anthrylene group, and the like. Examples of the trivalent aromatic hydrocarbon group include a group obtained by eliminating one hydrogen atom from an arylene group mentioned above, and the like.

The monovalent group having a structure shown by the general formula (7-2-2-1) includes a cyclic carbonate structure. The monovalent group having a structure shown by the general formula (7-2-2-1) may be a group that is directly bonded to $D^1$, or may be a group that includes a polycyclic structure including the cyclic carbonate structure mentioned, and the like. For example, a repeating unit shown by the following general formula (7-2-2i) includes a group that includes a polycyclic structure including the cyclic carbonate structure, and the like.

The number of carbon atoms of the monovalent group having a structure shown by the general formula (7-2-2-1) is preferably 3 to 30, more preferably 3 to 15, and particularly preferably 3 to 10. If the number of carbon atoms exceeds 30, the resist film may exhibit insufficient adhesion, so that pattern collapse or pattern separation may occur. Moreover, development defects may occur due to a decrease in solubility of the polymer component in a developer.

A monomer that produces the repeating unit shown by the general formula (7-2-2) may be synthesized by the known method disclosed in Tetrahedron Letters, Vol. 27, No. 32, p. 3741 (1986), Organic Letters, Vol. 4, No. 15, p. 2561 (2002), or the like.

Specific examples of the repeating unit shown by the general formula (7-2-2) include repeating units shown by the following general formulas (7-2-2a) to (7-2-2v), and the like. Note that $R^{36}$ in the general formulas (7-2-2a) to (7-2-2v) represents a hydrogen atom, a methyl group, or a trifluoromethyl group.

(7-2-2a)

(7-2-2b)

(7-2-2c)

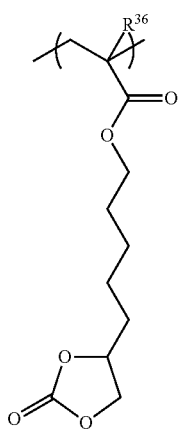

(7-2-2d)

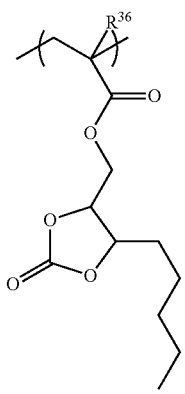

(7-2-2e)

(7-2-2f)

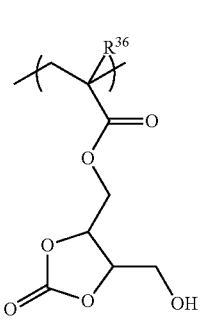

(7-2-2g)

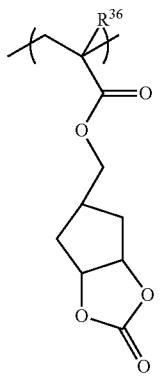

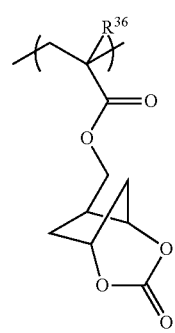 (7-2-2h)
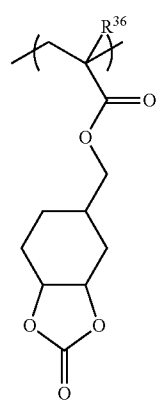 (7-2-2i)
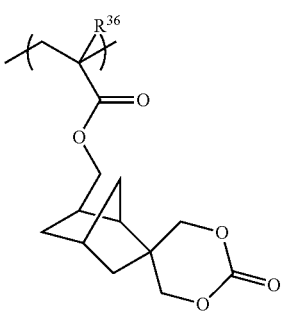 (7-2-2j)
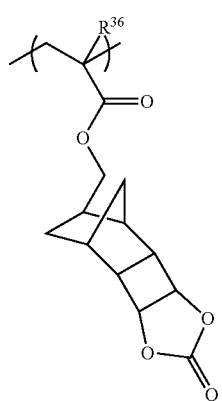 (7-2-2k)
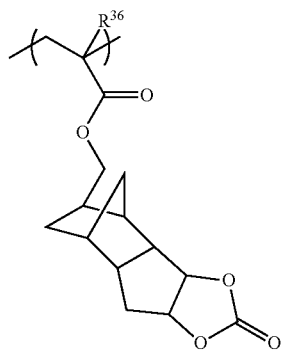 (7-2-2l)
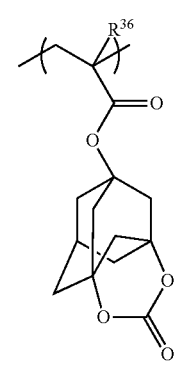 (7-2-2m)
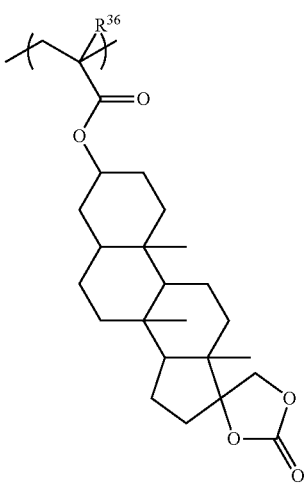 (7-2-2n)
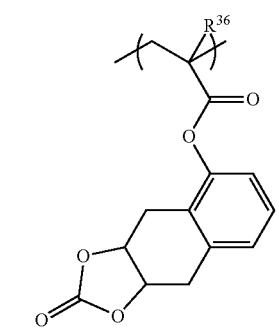 (7-2-2o)

(7-2-2p)
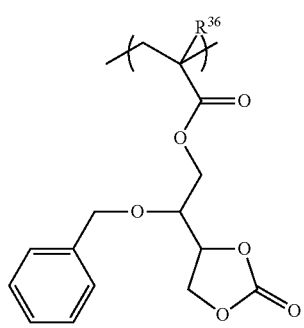

(7-2-2q)
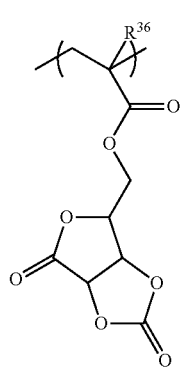

(7-2-2r)
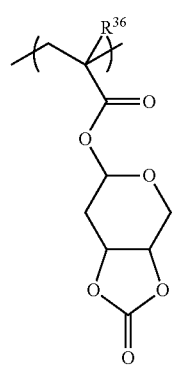

(7-2-2s)
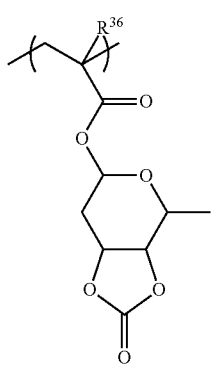

(7-2-2t)
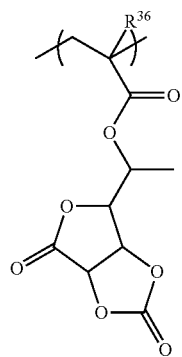

(7-2-2u)
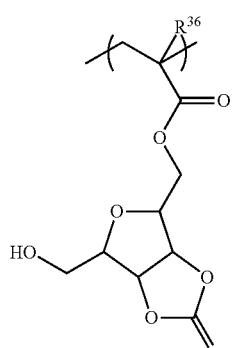

(7-2-2v)
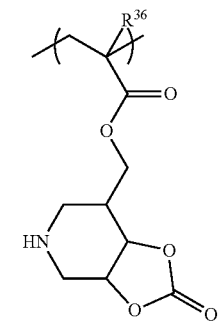

The polymer (A) may include only one type of the repeating unit (IV), or may include two or more types of the repeating unit (IV).

[1-1-3-3] Repeating Unit (V)

The alkali-soluble group included in the repeating unit (V) is preferably a functional group that includes a hydrogen atom having a pKa of 4 to 11 from the viewpoint of improving the solubility in a developer. Specific examples of such a functional group include functional groups shown by the following formulas (8a) and (8b), and the like.

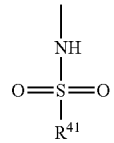
(8a)

(8b)

wherein $R^{41}$ represents a hydrocarbon group having 1 to 10 carbon atoms that is substituted with a fluorine atom.

The hydrocarbon group having 1 to 10 carbon atoms that is substituted with a fluorine atom represented by $R^{41}$ in the general formula (8a) is obtained by substituting one or more hydrogen atoms of a hydrocarbon group having 1 to 10 carbon atoms with a fluorine atom, and is preferably a trifluoromethyl group.

The main chain skeleton of the repeating unit (V) is not particularly limited, but is preferably a methacrylate skeleton, an acrylate skeleton, or an α-trifluoroacrylate skeleton.

Specific examples of a compound that produces the repeating unit (V) include compounds shown by the following general formulas (8a-1) and (8b-1), and the like.

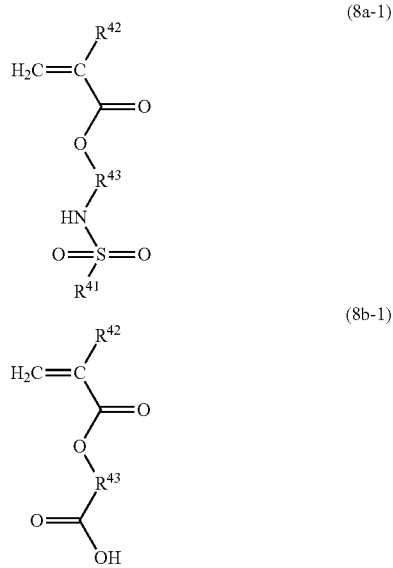

(8a-1)

(8b-1)

wherein $R^{42}$ represents a hydrogen atom, a methyl group, or a trifluoromethyl group, $R^{43}$ represents a single bond or a linear, branched, or cyclic saturated or unsaturated divalent hydrocarbon group having 1 to 20 carbon atoms, and $R^{41}$ represents a hydrocarbon group having 1 to 10 carbon atoms that is substituted with a fluorine atom.

Examples of the group represented by $R^{43}$ in the general formulas (8a-1) and (8b-1) include those mentioned above in connection with $R^{13}$ in the general formula (2-2). Examples of the hydrocarbon group having 1 to 10 carbon atoms that is substituted with a fluorine atom represented by $R^{41}$ in the general formula (8a-1) include those mentioned above in connection with $R^{41}$ in the general formula (8a).

The polymer (A) may include only one type of the repeating unit (V), or may include two or more types of the repeating unit (V).

[1-1-3-4] Repeating Unit (VI)

Examples of the repeating unit (VI) include a repeating unit shown by the following general formula (9), and the like.

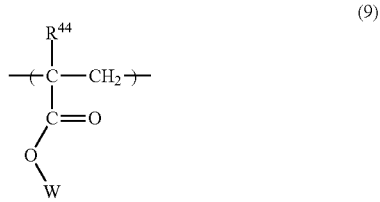

(9)

wherein $R^{44}$ represents a hydrogen atom, a methyl group, or a trifluoromethyl group, and W represents an alicyclic hydrocarbon group having 4 to 20 carbon atoms.

Examples of the alicyclic hydrocarbon group having 4 to 20 carbon atoms represented by W in the general formula (9) include hydrocarbon groups including an alicyclic ring derived from a cycloalkane such as cyclobutane, cyclopentane, cyclohexane, bicyclo[2.2.1]heptane, bicyclo[2.2.2]octane, tricyclo[5.2.1.0$^{2,6}$]decane, tetracyclo[6.2.1.1$^{3,6}$.0$^{2,7}$]dodecane, or tricyclo[3.3.1.1$^{3,7}$]decane, and the like.

The alicyclic ring derived from a cycloalkane may be substituted with at least one substituent such as a linear, branched, or cyclic alkyl group having 1 to 4 carbon atoms (e.g., methyl group, ethyl group, n-propyl group, i-propyl group, n-butyl group, 2-methylpropyl group, 1-methylpropyl group, or t-butyl group). Note that the alicyclic ring is not limited to the ones substituted with the alkyl group mentioned above and may be substituted with a hydroxyl group, a cyano group, a hydroxyalkyl group having 1 to 10 carbon atoms, a carboxyl group, or an oxygen atom.

Examples of a monomer that produces the repeating unit (VI) include bicyclo[2.2.1]hept-2-yl(meth)acrylate, bicyclo[2.2.2]oct-2-yl(meth)acrylate, tricyclo[5.2.1.0$^{2,6}$]dec-7-yl(meth)acrylate, tetracyclo[6.2.1.1$^{3,6}$.0$^{2,7}$]dodec-9-yl(meth)acrylate, tricyclo[3.3.1.1$^{3,7}$]dec-1-yl(meth)acrylate, tricyclo[3.3.1.1$^{3,7}$]dec-2-yl(meth)acrylate, and the like.

[1-1-3-5] Repeating Unit (VII)

The repeating unit (VII) is a repeating unit that is derived from an aromatic compound. Examples of a monomer that produces the repeating unit (VII) include styrene, α-methylstyrene, 2-methylstyrene, 3-methylstyrene, 4-methylstyrene, 2-methoxystyrene, 3-methoxystyrene, 4-methoxystyrene, 4-(2-t-butoxycarbonylethyloxy)styrene, 2-hydroxystyrene, 3-hydroxystyrene, 4-hydroxystyrene, 2-hydroxy-α-methylstyrene, 3-hydroxy-α-methylstyrene, 4-hydroxy-α-methylstyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, 2,4,6-trihydroxystyrene, 4-t-butoxystyrene, 4-t-butoxy-α-methylstyrene, 4-(2-ethyl-2-propoxy)styrene, 4-(2-ethyl-2-propoxy)-α-methylstyrene, 4-(1-ethoxyethoxy)styrene, 4-(1-ethoxyethoxy)-α-methylstyrene, phenyl(meth)acrylate, benzyl(meth)acrylate, acenaphthylene, 5-hydroxyacenaphthylene, 1-vinylnaphthalene, 2-vinylnaphthalene, 2-hydroxy-6-vinylnaphthalene, 1-naphthyl(meth)acrylate, 2-naphthyl(meth)acrylate, 1-naphthylmethyl(meth)acrylate, 1-anthryl(meth)acrylate, 2-anthryl(meth)acrylate, 9-anthryl(meth)acrylate, 9-anthrylmethyl(meth)acrylate, 1-vinylpyrene, and the like.

[1-1-3-6] Repeating Unit (VIII)

The repeating unit (VIII) is a repeating unit other than the repeating units (I) to (VII). Examples of a monomer (polymerizable unsaturated monomer) that produces the repeating unit (VIII) include alicyclic unsaturated compounds such as 5-fluorobicyclo[2.2.1]hept-2-ene, 5,5-difluorobicyclo[2.2.1]hept-2-ene, 5,6-difluorobicyclo[2.2.1]hept-2-ene, 5,5,6-trifluorobicyclo[2.2.1]hept-2-ene, 5,5,6,6-tetrafluorobicyclo[2.2.1]hept-2-ene, 5,5-difluoro-6,6-di(trifluoromethyl)bicyclo[2.2.1]hept-2-ene, 5,6-difluoro-5,6-di(trifluoromethyl)bicyclo[2.2.1]hept-2-ene, 5,5,6-trifluoro-6-trifluoromethylbicyclo[2.2.1]hept-2-ene, 5,5,6-trifluoro-6-trifluoromethoxybicyclo[2.2.1]hept-2-ene, 5,5,6-trifluoro-6-pentafluoro-n-propoxybicyclo[2.2.1]hept-2-ene, 5-fluoro-5-pentafluoroethyl-6,6-di(trifluoromethyl)bicyclo[2.2.1]hept-2-ene, 5,6-difluoro-5-heptafluoro-i-propyl-6-trifluoromethylbicyclo[2.2.1]hept-2-ene, 5-chloro-5,6,6-trifluorobicyclo[2.2.1]hept-2-ene, 5,6-dichloro-5,6-bis(trifluoromethyl)bicyclo[2.2.1]hept-2-ene, 5-(2,2,2-trifluorocarboethoxy)bicyclo[2.2.1]hept-2-ene, 5-methyl-5-(2,2,2-trifluorocarboethoxy)bicyclo[2.2.1]hept-2-ene, 8-fluorotetracyclo[6.2.1.1$^{3,6}$.0$^{2,7}$]dodec-3-ene, 8,8-difluorotetracyclo[6.2.1.1$^{3,6}$.0$^{2,7}$]dodec-3-ene, 8,9-difluorotetracyclo[6.2.1.1$^{3,6}$.0$^{2,7}$]dodec-3-ene, 8,8,9-trifluorotetracyclo

[6.2.1.1$^{3,6}$.0$^{2,7}$]dodec-3-ene, 8,8,9,9-tetrafluorotetracyclo[6.2.1.1$^{3,6}$.0$^{2,7}$]dodec-3-ene, 8,8-difluoro-9,9-di(trifluoromethyl)tetracyclo[6.2.1.1$^{3,6}$.0$^{2,7}$]dodec-3-ene, 8,9-difluoro-8,9-di(trifluoromethyl)tetracyclo[6.2.1.1$^{3,6}$.0$^{2,7}$]dodec-3-ene, 8,8,9-trifluoro-9-trifluoromethyltetracyclo[6.2.1.1$^{3,6}$.0$^{2,7}$]dodec-3-ene, 8,8,9-trifluoro-9-trifluoromethoxytetracyclo[6.2.1.1$^{3,6}$.0$^{2,7}$]dodec-3-ene, 8,8,9-trifluoro-9-pentafluoro-n-propoxytetracyclo[6.2.1.1$^{3,6}$.0$^{2,7}$]dodec-3-ene, 8-fluoro-8-pentafluoroethyl-9,9-di(trifluoromethyl)tetracyclo[6.2.1.1$^{3,6}$.0$^{2,7}$]dodec-3-ene, 8,9-difluoro-8-heptafluoro-i-propyl-9-trifluoromethyltetracyclo[6.2.1.1$^{3,6}$.0$^{2,7}$]dodec-3-ene, 8-chloro-8,9,9-trifluorotetracyclo[6.2.1.1$^{3,6}$.0$^{2,7}$]dodec-3-ene, 8,9-dichloro-8,9-di(trifluoromethyl)tetracyclo[6.2.1.1$^{3,6}$.0$^{2,7}$]dodec-3-ene, 8-(2,2,2-trifluorocarboethoxy)tetracyclo[6.2.1.1$^{3,6}$.0$^{2,7}$]dodec-3-ene, 8-methyl-8-(2,2,2-trifluorocarboethoxy)tetracyclo[6.2.1.1$^{3,6}$.0$^{2,7}$]dodec-3-ene, dicyclopentadiene, tricyclo[5.2.1.0$^{2,6}$]dec-8-ene, tricyclo[5.2.1.0$^{2,6}$]dec-3-ene, tricyclo[4.4.0.1$^{2,5}$]undec-3-ene, tricyclo[6.2.1.0$^{1,8}$]undec-9-ene, tricyclo[6.2.1.0$^{1,8}$]undec-4-ene, tetracyclo[6.2.1.1$^{3,6}$.0$^{2,7}$]dodec-3-ene, 8-methyltetracyclo[6.2.1.1$^{3,6}$.0$^{2,7}$]dodec-3-ene, 8-ethylidenetetracyclo[6.2.1.1$^{3,6}$.0$^{2,7}$]dodec-3-ene, 8-ethylidenetetracyclo[6.2.1.1$^{3,6}$.0$^{2,7}$]dodec-3-ene, pentacyclo[6.5.1.1$^{3,6}$.0$^{2,7}$.0$^{9,13}$]pentadec-4-ene, and pentacyclo[7.4.0.1$^{2,5}$.1$^{9,12}$.0$^{8,13}$]pentadec-3-ene;
(meth)acrylates such as methyl(meth)acrylate, ethyl(meth)acrylate, n-propyl(meth)acrylate, n-butyl(meth)acrylate, 2-methylpropyl(meth)acrylate, 2-hydroxyethyl(meth)acrylate, 2-hydroxypropyl(meth)acrylate, 3-hydroxypropyl(meth)acrylate, cyclopropyl(meth)acrylate, cyclopentyl(meth)acrylate, cyclohexyl(meth)acrylate, cyclohexenyl(meth)acrylate, 4-methoxycyclohexyl(meth)acrylate, 2-cyclopropyloxycarbonylethyl(meth)acrylate, 2-cyclopentyloxycarbonylethyl(meth)acrylate, 2-cyclohexyloxycarbonylethyl(meth)acrylate, 2-cyclohexenyloxycarbonylethyl(meth)acrylate, 2-(4'-methoxycyclohexyl)oxycarbonylethyl(meth)acrylate, norbornyl(meth)acrylate, isobornyl(meth)acrylate, tricyclodecanyl(meth)acrylate, tetracyclodecanyl(meth)acrylate, dicyclopentenyl(meth)acrylate, adamantyl(meth)acrylate, adamantylmethyl(meth)acrylate, and 1-methyladamantyl(meth)acrylate; α-hydroxymethylacrylates such as methyl α-hydroxymethylacrylate, ethyl α-hydroxymethylacrylate, n-propyl α-hydroxymethylacrylate, and n-butyl α-hydroxymethylacrylate;
vinyl esters such as vinyl acetate, vinyl propionate, and vinyl butyrate; unsaturated nitrile compounds such as (meta)acrylonitrile, α-chloroacrylonitrile, crotonitrile, maleinitrile, fumarnitrile, mesaconitrile, citraconitrile, and itaconitrile; unsaturated amide compounds such as (meth)acrylamide, N,N-dimethyl(meth)acrylamide, crotonamide, maleinamide, fumaramide, mesaconamide, citraconamide, and itaconamide; other nitrogen-containing vinyl compounds such as N-vinyl-ε-caprolactam, N-vinylpyrrolidone, vinylpyridine, and vinylimidazole; unsaturated carboxylic acids (anhydrides) such as (meth)acrylic acid, crotonic acid, maleic acid, maleic anhydride, fumaric acid, itaconic acid, itaconic anhydride, citraconic acid, citraconic anhydride, and mesaconic acid; carboxyl group-containing esters of unsaturated carboxylic acids such as 2-carboxyethyl(meth)acrylate, 2-carboxypropyl(meth)acrylate, 3-carboxypropyl(meth)acrylate, 4-carboxybutyl(meth)acrylate, 4-carboxycyclohexyl(meth)acrylate, carboxytricyclodecanyl(meth)acrylate, and carboxytetracyclodecanyl(meth)acrylate; and
polyfunctional monomers such as methylene glycol di(meth)acrylate, ethylene glycol di(meth)acrylate, propylene glycol di(meth)acrylate, 1,6-hexanediol di(meth)acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl)benzene di(meth)acrylate, 1,3-bis(2-hydroxypropyl)benzene di(meth)acrylate, 1,2-adamantanediol di(meth)acrylate, 1,3-adamantanediol di(meth)acrylate, 1,4-adamantanediol di(meth)acrylate, and tricyclodecanyldimethylol di(meth)acrylate.

[1-1-3-7] Content of Additional Repeating Unit

The content of each repeating unit based on the total repeating units (=100 mol %) included in the polymer (A) is preferably as follows. The content of the repeating unit (III) is normally 80 mol % or less, preferably 20 to 80 mol %, and more preferably 30 to 70 mol %. If the content of the repeating unit (III) is within the above range, the difference between the advancing contact angle and the receding contact angle during liquid immersion lithography can be reduced. The content of the repeating unit (IV) or (V) is normally 50 mol % or less, preferably 5 to 30 mol %, and more preferably 5 to 20 mol %. If the content of the repeating unit (IV) or (V) is within the above range, water repellency can be obtained during liquid immersion lithography while improving affinity to a developer. The content of the repeating unit (VI), (VII), or (VIII) is normally 50 mol % or less, independently.

[1-1-4] Content of Polymer (A)

The polymer (A) is preferably used in an amount of 0.1 to 20 parts by mass based on 100 parts by mass of the polymer (B). If the amount of the polymer (A) is within the above range, the polymer (A) can be unevenly distributed in the surface layer of the resist film. Moreover, the developability of the resist film can be maintained. If the amount of the polymer (A) is less than 0.1 parts by mass, the polymer (A) may not be sufficiently unevenly distributed in the surface layer of the resist film. If the amount of the polymer (A) exceeds 20 parts by mass, the developability of the resist film may be impaired.

The polystyrene-reduced weight average molecular weight (hereinafter may be referred to as "Mw") of the polymer (A) determined by gel permeation chromatography (GPC) is preferably 1000 to 50,000, more preferably 1000 to 40,000, and particularly preferably 1000 to 30,000. If the Mw of the polymer (A) is less than 1000, a resist film having a sufficient receding contact angle may not be obtained. If the Mw of the polymer (a) exceeds 50,000, the developability of the resist film may deteriorate (i.e., development defects may occur).

The ratio (Mw/Mn) of the Mw to the polystyrene-reduced number average molecular weight (hereinafter may be referred to as "Mn") of the polymer (A) determined by GPC is preferably 1 to 5, and more preferably 1 to 4. If the ratio (Mw/Mn) exceeds 5, a resist film having a sufficient receding contact angle may not be obtained. Moreover, the developability of the resist film may deteriorate (i.e., development defects may occur).

[1-1-5] Production of Polymer (A)

The polymer (A) may be produced as described below, for example. Specifically, the polymer (A) may be produced by providing a monomer composition that includes a monomer that produces the repeating unit (I) shown by the general formula (1) and a monomer that produces the repeating unit that includes fluorine atom (repeating unit (II)), and polymerizing the monomers included in the monomer composition in an appropriate solvent optionally in the presence of a chain transfer agent using a radical initiator (e.g., hydroperoxides, dialkyl peroxides, diacyl peroxides, or azo compound).

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylates such as ethyl acetate, n-butyl acetate, i-butyl acetate, and methyl propionate; ketones such as acetone, 2-butanone, 4-methyl-2-pentanone, and 2-heptanone; ethers such as tetrahydrofuran, dimethoxyethanes, and diethoxyethanes; alcohols such as methanol, ethanol, 1-propanol, 2-propanol, and 4-methyl-2-pentanol; and the like. These solvents may be used either alone or in combination.

The polymerization temperature is preferably 40 to 150° C., and more preferably 50 to 120° C. The reaction time is preferably 1 to 48 hours, and more preferably 1 to 24 hours.

The radiation-sensitive resin composition may include only one type of the polymer (A), or may include two or more types of the polymer (A).

[1-2] Polymer (B)

The polymer (B) includes an acid-labile group, and is insoluble or scarcely soluble in an alkali (excluding a polymer that includes the repeating unit (I) shown by the general formula (1)). The polymer (B) is a component that serves as a base material of the radiation-sensitive resin composition. The polymer (B) differs from the polymer (A).

The polymer (B) is not particularly limited as long as the polymer (B) is insoluble or scarcely soluble in an alkali, but becomes alkali-soluble due to an acid. It is preferable that the polymer (B) include the repeating unit shown by the general formula (7-1) and the repeating unit shown by the general formula (7-2). Note that the expression "insoluble or scarcely soluble in an alkali" used herein means that a film (thickness: 100 nm) that is formed only of the polymer (B) has a thickness equal to or more than 50% of the initial thickness when developed under alkaline development conditions employed when forming a resist pattern using a resist film that is formed of a radiation-sensitive resin composition that includes the polymer (B).

[1-2-1] Repeating Unit (7-1)

The content of the repeating unit (7-1) in the polymer (B) is preferably 15 to 85 mol %, more preferably 25 to 75 mol %, and particularly preferably 35 to 60 mol %, based on the total repeating units included in the polymer (B). If the content of the repeating unit (7-1) is less than 15 mol %, the pattern shape may deteriorate due to a decrease in contrast after dissolution. If the content of the repeating unit (7-1) exceeds 85 mol %, the resulting pattern may peel off due to insufficient adhesion to a substrate.

[1-2-2] Repeating Unit (7-2)

The content of the repeating unit (7-2) in the polymer (B) is preferably 5 to 75 mol %, more preferably 15 to 65 mol %, and particularly preferably 25 to 55 mol %, based on the total repeating units included in the polymer (B). If the content of the repeating unit (7-2) is less than 5 mol %, the resulting pattern may peel off due to insufficient adhesion to a substrate. If the content of the repeating unit (7-2) exceeds 75 mol %, the pattern shape may deteriorate due to a decrease in contrast after dissolution.

[1-2-3] Additional Repeating Unit

The polymer (B) may include a repeating unit other than the repeating units (7-1) and (7-2) (hereinafter may be referred to as "additional repeating unit"). Examples of a monomer (polymerizable unsaturated monomer) that produces the additional repeating unit include those mentioned above in connection with the repeating unit (V) or (VI).

[1-2-4] Production of Polymer (B)

The polymer (B) may be produced as described below, for example. Specifically, the polymer (B) may be produced by providing a monomer composition that includes a monomer that produces the repeating unit (7-1) and a monomer that produces the repeating unit (7-2), and copolymerizing the monomers included in the monomer composition in an appropriate solvent optionally in the presence of a chain transfer agent using a radical initiator (e.g., hydroperoxides, dialkyl peroxides, diacyl peroxides, or azo compound).

Examples of the solvent include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutane, bromohexane, dichloroethane, hexamethylene dibromide, and chlorobenzene; saturated carboxylic acid esters such as ethyl acetate, n-butyl acetate, i-butyl acetate, and methyl propionate; ethers such as tetrahydrofuran, dimethoxyethane, and diethoxyethane; and the like. These solvents may be used either alone or in combination.

The reaction temperature is normally 40 to 120° C., and preferably 50 to 90° C. The reaction time is normally 1 to 48 hours, and preferably 1 to 24 hours.

The polystyrene-reduced weight average molecular weight (hereinafter may be referred to as "Mw") of the polymer (B) determined by gel permeation chromatography (GPC) is normally 3000 to 300,000, preferably 4000 to 200,000, and still more preferably 4000 to 100,000. If the Mw of the polymer (B) is less than 3000, the heat resistance of the resist film may deteriorate. If the Mw of the polymer (B) exceeds 300,000, the developability of the resist film may deteriorate.

It is preferable that the polymer (B) have an impurity (e.g., halogens and metals) content as low as possible. The sensitivity, the resolution, the process stability, the pattern shape, and the like of the resist film can be further improved by reducing the impurity content in the polymer (B). The polymer (B) may be purified by chemical purification (e.g., washing with water or liquid-liquid extraction), or a combination of chemical purification and physical purification (e.g., ultrafiltration or centrifugation), for example. The radiation-sensitive resin composition may include only one type of the polymer (B), or may include two or more types of the polymer (B).

[1-3] Radiation-Sensitive Acid Generator (C)

The radiation-sensitive acid generator (C) (acid generator (C)) generates an acid upon application of radiation (hereinafter referred to as "exposure"). The acid-labile group included in the polymer (B) dissociates due to an acid generated by the acid generator (C) upon exposure, so that the polymer (B) become alkali-soluble. As a result, the exposed area of the resist film becomes readily soluble in an alkaline developer, so that a positive-tone resist pattern can be formed. Examples of the acid generator (C) include the compounds disclosed in paragraphs [0163] to [0164] of JP 2009-134088 A, and the like.

Specific examples of a preferable acid generator (C) include diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, triphenylsulfonium trifluoromethanesulfonate, triphenylsulfonium nonafluoro-n-butanesulfonate, triphenylsulfonium perfluoro-n-octanesulfonate, cyclohexyl.2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, 4-hydroxy-1-naphthyldimethylsulfonium trifluoromethanesulfonate, 4-hydroxy-1-naphthyltetrahydrothiophenium trifluoromethanesulfonate, 4-hydroxy-1-naphthyltetrahydrothiophenium nonafluoro-n-butanesulfonate, 4-hydroxy-1-naphthyltetrahydrothiophenium perfluoro-n-octanesulfonate, 1-(1-naphthylacetomethyl)tetrahydrothiophenium trifluoromethanesulfonate, 1-(1-naphthylacetomethyl)tetrahydrothiophenium nonafluoro-n-butanesulfonate, 1-(1-naphthylacetomethyl)tetrahydrothiophenium perfluoro-n-octanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimidetrifluoromethanesulfonate, N-hydroxysuccinimidenonafluoro-n-butanesulfonate, N-hydroxysuccinimideperfluoro-n-octanesulfonate, and 1,8-naphthalenedicarboxylic acid imide trifluoromethanesulfonate. The radiation-sensitive resin composition may include only one type of the acid generator (C), or may include two or more types of the acid generator (C).

The acid generator (C) is preferably used in an amount of 0.1 to 30 parts by mass, more preferably 2 to 27 parts by mass, and particularly preferably 5 to 25 parts by mass, based on 100 parts by mass of the polymer (B). If the amount of the acid generator (C) is less than 0.1 parts by mass, the sensitivity and the resolution of the resist film may deteriorate. If the amount of the acid generator (C) exceeds 30 parts by mass, the applicability and the pattern shape as a resist film may deteriorate.

[1-4] Additional Component

The radiation-sensitive resin composition of the embodiment of the invention may optionally include various additives such as an acid diffusion controller, an alicyclic additive, a surfactant, a sensitizer, a halation inhibitor, an adhesion improver, a preservative, and an anti-foaming agent.

[1-4-1] Acid Diffusion Controller

Examples of the acid diffusion controller include a compound shown by the following general formula (10) (hereinafter referred to as "nitrogen-containing compound (I)"), a compound that includes two nitrogen atoms in the molecule (hereinafter referred to as "nitrogen-containing compound (II)"), a compound that includes three or more nitrogen atoms in the molecule (hereinafter referred to as "nitrogen-containing compound (III)"), an amide group-containing compound, a urea compound, a nitrogen-containing heterocyclic compound, and the like. The acid diffusion controller improves the pattern shape and the dimensional accuracy of the resist.

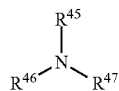

(10)

wherein $R^{45}$ to $R^{47}$ independently represent a hydrogen atom, a substituted or unsubstituted linear, branched, or cyclic alkyl group, an aryl group, or an aralkyl group.

Examples of the nitrogen-containing compound (I) include monoalkylamines such as n-hexylamine, n-heptylamine, n-octylamine, n-nonylamine, and n-decylamine; dialkylamines such as di-n-butylamine, di-n-pentylamine, di-n-hexylamine, di-n-heptylamine, di-n-octylamine, di-n-nonylamine, and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, and tri-n-decylamine; and aromatic amines such as aniline, N-methylaniline, N,N-dimethylaniline, 2-methylaniline, 3-methylaniline, 4-methylaniline, 4-nitroaniline, diphenylamine, triphenylamine, 1-naphthylamine, 2-(4-aminophenyl)-2-(3-hydroxyphenyl)propane, and 2-(4-aminophenyl)-2-(4-hydroxyphenyl)propane.

Examples of the nitrogen-containing compounds (II) include ethylenediamine, N,N,N',N'-tetramethylethylenediamine, N,N,N',N'-tetrakis(2-hydroxypropyl)ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 1,4-bis[1-(4-aminophenyl)-1-methylethyl]benzene, 1,3-bis[1-(4-aminophenyl)-1-methylethyl]benzene, and the like.

Examples of the nitrogen-containing compound (III) include polyethyleneimine, polyallylamine, dimethylaminoethylacrylamide, and the like.

Examples of the amide group-containing compound include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compounds include pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, quinoline, 8-oxyquinoline, and acridine, pyrazine, pyrazole, pyridazine, quinoxaline, purine, pyrrolidine, piperidine, morpholine, 4-methylmorpholine, piperazine, 1,4-dimethylpiperazine, 1,4-diazabicyclo[2.2.2]octane, and the like.

Among these, the nitrogen-containing compound (I), the nitrogen-containing compound (II), and the nitrogen-containing heterocyclic compound are preferable. These acid diffusion controllers may be used either alone or in combination. The acid diffusion controller is preferably used in an amount of 10 parts by mass or less, and more preferably 5 parts by mass, based on 100 parts by mass of the polymer (B). If the amount of the acid diffusion controller is too large, the sensitivity of the resist film may unduly decrease.

[1-4-2] Alicyclic Additive

The alicyclic additive further improves the dry etching resistance, the pattern shape, adhesion to a substrate, and the like. Examples of the alicyclic additive include adamantane derivatives such as t-butyl 1-adamantanecarboxylate, t-butoxycarbonylmethyl 1-adamantanecarboxylate, di-t-butyl 1,3-adamantanedicarboxylate, t-butyl 1-adamantaneacetate, t-butoxycarbonylmethyl 1-adamantaneacetate, and di-t-butyl 1,3-adamantanediacetate; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; and the like. These alicyclic additives may be used either alone or in combination. The alicyclic additive is normally used in an amount of 50 parts by mass or less, and preferably 30 parts by mass or less, based on 100 parts by mass of the polymer (B).

[1-4-3] Surfactant

The surfactant improves the applicability, the developability, and the like of the radiation-sensitive resin composition. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate, commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), and the like. These surfactants may be used either alone or in combination. The surfactant is normally used in an amount of 2 parts by mass or less based on 100 parts by mass of the polymer (B).

[1-5] Preparation of Radiation-Sensitive Resin Composition

The radiation-sensitive resin composition (composition solution) may be prepared by dissolving the components in a solvent so that the total solid content is normally 1 to 50 mass %, and preferably 3 to 25 mass %, and filtering the solution through a filter having a pore size of about 0.02 µm, for example.

[1-5-1] Solvent

Examples of the solvent used to prepare the composition solution include linear or branched ketones, cyclic ketones, propylene glycol monoalkyl ether acetates, alkyl 2-hydroxypropionates, alkyl 3-alkoxypropionates, n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methylpropionate, ethoxyethyl acetate, ethyl hydroxyacetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl pyruvate, ethyl pyruvate, N-methylpyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate, and the like.

Among these, linear or branched ketones, cyclic ketones, propylene glycol monoalkyl ether acetates, alkyl 2-hydroxypropionates, and alkyl 3-alkoxypropionates are preferable. These solvents may be used either alone or in combination.

[2] Resist Pattern-Forming Method

A resist pattern-forming method according to the embodiment of the invention includes (1) forming a resist film on a substrate using the radiation-sensitive resin composition according to the embodiment of the invention (hereinafter may be referred to as "step (1)"), (2) exposing the resist film (hereinafter may be referred to as "step (2)"), and (3) developing the exposed resist film to form a resist pattern (hereinafter may be referred to as "step (3)"). The resist pattern-forming method can thus form a resist pattern having an excellent cross-sectional shape.

[2-1] Step (1)

In the step (1), a resist film is formed on a substrate using the radiation-sensitive resin composition according to the embodiment of the invention mentioned above. The resist film formed by the step (1) has a high receding contact angle with an immersion liquid (e.g., water), and rarely produces development defects.

A silicon wafer, an aluminum-coated wafer, or the like may be used as the substrate.

The resist film may be formed by applying a resin composition solution prepared using the radiation-sensitive resin composition according to the embodiment of the invention to the substrate by an appropriate coating method (e.g., rotational coating, cast coating, or roll coating), and prebaking (PB) the resulting film to volatilize the solvent from the film, for example. The resin composition solution may be prepared by filtering the radiation-sensitive resin composition that has been adjusted in total solid content (normally 1 to 50 mass %) through a filter having a pore size of about 0.2 µm.

The thickness of the resist film is not particularly limited, but is preferably 10 to 5000 nm, and more preferably 10 to 2000 nm.

The prebaking temperature is determined depending on the composition of the radiation-sensitive resin composition, but is preferably about 30 to 200° C., and more preferably 50 to 150° C.

[2-2] Step (2)

In the step (2), the resist film formed by the step (1) is exposed. Specifically, the acid-labile group included in the polymer (B) dissociates due to an acid generated by the acid generator (C) upon exposure, so that the solubility of the exposed area of the resist in an alkaline developer increases. Therefore, the exposed area can be dissolved in an alkaline developer.

Radiation used for exposure may be appropriately selected depending on the type of the acid generator (C). Examples of radiation used for exposure include visible rays, ultraviolet rays, far ultraviolet rays, X-rays, charged particle rays, and the like. It is preferable to use far ultraviolet rays such as ArF excimer laser (wavelength: 193 nm) or KrF excimer laser (wavelength: 248 nm). It is particularly preferable to use ArF excimer laser (wavelength: 193 nm).

The exposure conditions (e.g., dose) may be appropriately selected depending on the composition of the radiation-sensitive resin composition, the type of additive, and the like.

It is preferable to perform post-exposure bake (PEB) after exposure. PEB ensures that the acid-labile group dissociates smoothly. The PEB temperature may be appropriately selected depending on the composition of the radiation-sensitive resin composition, but is preferably 30 to 200° C., and more preferably 50 to 170° C.

In order to maximize the potential of the radiation-sensitive resin composition, an organic or inorganic antireflective film may be formed on a substrate, as disclosed in JP 6-12452 B (JP 59-93448 A), for example. A protective film may be formed on the resist film so that the resist film is not affected by basic impurities and the like contained in the environmental atmosphere, as disclosed in JP 5-188598 A, for example. These techniques may be used in combination.

In the step (2), it is preferable to expose the resist film formed by the step (1) via an immersion liquid provided over the resist film. Specifically, it is preferable to subject the resist film to liquid immersion lithography. In this case, a liquid immersion lithography protective film may be formed on the resist film (see JP 2005-352384 A, for example) in order to prevent elution of the acid generator and the like into the immersion liquid.

Examples of the immersion liquid include purified water, hydrocarbons, fluorine-containing hydrocarbons, and the like.

[2-3] Step (3)

In the step (3), the exposed resist film is developed to form a resist pattern.

Examples of a developer used for development include an alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water.

The concentration of the alkaline aqueous solution is preferably 10 mass % or less. If the concentration of the aqueous alkaline solution exceeds 10 mass %, the unexposed area may be dissolved in the developer.

An organic solvent may be added to the alkaline aqueous solution (developer). Examples of the organic solvent include ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like. These organic solvents may be used either alone or in combination.

The organic solvent is preferably used in an amount of 100 parts by volume or less based on 100 parts by volume of the alkaline aqueous solution. If the amount of the organic solvent exceeds 100 parts by volume, the exposed area may remain undeveloped due to a decrease in developability.

An appropriate amount of a surfactant or the like may also be added to the alkaline aqueous solution (developer).

After development using the aqueous alkaline solution (developer), the resist film is preferably rinsed with water, and dried.

[3] Polymer

A polymer according to the embodiment of the invention includes a repeating unit (3) shown by the following general formula (3), and includes a fluorine atom in its molecule in the same manner as the polymer (A) included in the radiation-sensitive resin composition according to the embodiment of the invention. The polymer may suitably be used as a material for a radiation-sensitive resin composition that may form a resist pattern having an excellent cross-sectional shape.

rein $R^{17}$ represents a hydrogen atom, a methyl group, or a trifluoromethyl group, $X^2$ represents a single bond, a group shown by —O—$R^{21}$—, a group shown by —C(=O)—O—$R^{21}$—, a group shown by —C(=O)—NH—$R^{21}$—, a linear or branched alkanediyl group having 1 to 4 carbon atoms, or a phenylene group, $R^{21}$ represents a linear, branched, or cyclic hydrocarbon group having 1 to 10 carbon atoms that may include an ester group or an ether group, or a single bond, $R^{18}$ represents a single bond, a substituted or unsubstituted linear, branched, or cyclic alkanediyl group having 1 to 20 carbon atoms, a substituted or unsubstituted alkenylene group having 2 to 20 carbon atoms, a substituted or unsubstituted arylene group having 6 to 10 carbon atoms, or a substituted or unsubstituted aralkylene group, $R^{19}$ represents a hydrogen atom, a substituted or unsubstituted linear, branched, or cyclic alkyl group having 1 to 20 carbon atoms, a substituted or unsubstituted alkenyl group having 2 to 20 carbon atoms, a substituted or unsubstituted aryl group having 6 to 10 carbon atoms, or a substituted or unsubstituted aralkyl group, provided that $R^{18}$ and $R^{19}$ may bond to each other to form a cyclic structure having 3 to 20 carbon atoms together with a nitrogen atom bonded to $R^{18}$ and $R^{19}$, and $R^{20}$ represents an acid-labile group.

In the embodiment of the invention, it is preferable that the repeating unit (3) shown by the general formula (3) be a repeating unit shown by the following general formula (3-1).

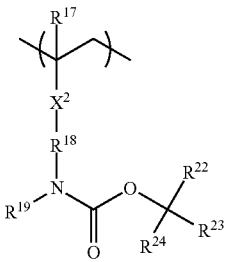

(3-1)

wherein $R^{17}$ represents a hydrogen atom, a methyl group, or a trifluoromethyl group, $X^2$ represents a single bond, a group shown by —O—$R^{21}$—, a group shown by —C(=O)—O—$R^{21}$—, a group shown by —C(=O)—NH—$R^{21}$—, a linear or branched alkanediyl group having 1 to 4 carbon atoms, or a phenylene group, $R^{21}$ represents a linear, branched, or cyclic hydrocarbon group having 1 to 10 carbon atoms that may include an ester group or an ether group, or a single bond, $R^{18}$ represents a single bond, a substituted or unsubstituted linear, branched, or cyclic alkanediyl group having 1 to 20 carbon atoms, a substituted or unsubstituted alkenylene group having 2 to 20 carbon atoms, a substituted or unsubstituted arylene group having 6 to 10 carbon atoms, or a substituted or unsubstituted aralkylene group, $R^{19}$ represents a hydrogen atom, a substituted or unsubstituted linear, branched, or cyclic alkyl group having 1 to 20 carbon atoms, a substituted or unsubstituted alkenyl group having 2 to 20 carbon atoms, a substituted or unsubstituted aryl group having 6 to 10 carbon atoms, or a substituted or unsubstituted aralkyl group, provided that $R^{18}$ and $R^{19}$ may bond to each other to form a cyclic structure having 3 to 20 carbon atoms together with a nitrogen atom bonded to $R^{18}$ and $R^{19}$, and $R^{22}$, $R^{23}$, and $R^{24}$ independently represent a linear or branched alkyl group having 1 to 4 carbon atoms, a monovalent alicyclic hydrocarbon group having 4 to 20 carbon atoms, an aryl group, or an aralkyl group, or $R^{22}$ and $R^{23}$ bond to each other to form an alicyclic hydrocarbon group having 4 to 20 carbon atoms together with a carbon atom bonded to $R^{22}$ and $R^{23}$, and $R^{24}$ represents a linear or branched alkyl group having 1 to 4 carbon atoms, a monovalent alicyclic hydrocarbon group having 4 to 20 carbon atoms, an aryl group, or an aralkyl group.

The polymer according to the embodiment of the invention is not particularly limited as long as the polymer includes the repeating unit (3) and includes a fluorine atom in its molecule, but preferably further includes a repeating unit (4) that includes a fluorine atom (hereinafter may be referred to as "repeating unit (4)"), and more preferably includes at least one of a repeating unit shown by the following general formula (4-1) (hereinafter may be referred to as "repeating unit (4-1)") and a repeating unit shown by the following general formula (4-2) (hereinafter may be referred to as "repeating unit (4-2)"). When the polymer includes at least one of the repeating unit (4-1) and the repeating unit (4-2), it may be possible to use as a material which can form a resist pattern having a more excellent cross-sectional shape.

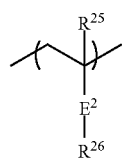

(4-1)

wherein $R^{25}$ represents a hydrogen atom, a methyl group, or a trifluoromethyl group, $E^2$ represents a linking group, and $R^{26}$ represents a linear or branched alkyl group having 1 to 6 carbon atoms that is substituted with at least one fluorine atom, a monovalent alicyclic hydrocarbon group having 4 to 20 carbon atoms that is substituted with at least one fluorine atom, or a derivative thereof

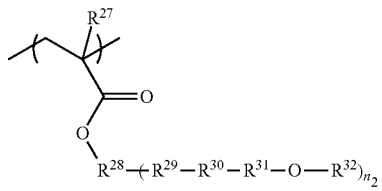

(4-2)

wherein $R^{2,7}$ represents a hydrogen atom, a methyl group, or a trifluoromethyl group, $R^{28}$ represents a single bond or a linear, branched, or cyclic saturated or unsaturated $(n_2+1)$-valent hydrocarbon group having 1 to 10 carbon atoms, $R^{29}$ represents a single bond or a linear, branched, or cyclic saturated or unsaturated divalent hydrocarbon group having 1 to 20 carbon atoms, $R^{30}$ represents a methylene group that is substituted with a fluorine atom, or a linear or branched fluoroalkanediyl group having 2 to 20 carbon atoms, $R^{31}$ represents a single bond or —CO—, $R^{32}$ represents a hydrogen atom or an acid-labile group, and $n_2$ is an integer from 1 to 3.

The polymer according to the embodiment of the invention may be synthesized in the same manner as the polymer (A).

EXAMPLES

The invention is further described below by way of examples and comparative examples. Note that the invention is not limited to the following examples. In the following examples, the units "parts" and "%" respectively refer to "parts by mass" and "mass %" unless otherwise specified. The property value measuring methods and the property evaluation methods employed in the examples are described below.

Weight Average Molecular Weight (Mw) and Number Average Molecular Weight (Mn)

The weight average molecular weight (Mw) and the number average molecular weight (Mn) of the polymer were determined by gel permeation chromatography (GPC) using GPC columns manufactured by Tosoh Corporation (G2000HXL×2, G3000HXL×1, G4000HXL×1) (flow rate: 1.0 ml/min, column temperature: 40° C., eluant: tetrahydrofuran, standard: monodisperse polystyrene).

$^{13}$C-NMR Analysis

The polymer (A) was subjected to $^{13}$C-NMR analysis using a nuclear magnetic resonance spectrometer ("JNM-ECX400" manufactured by JEOL Ltd.).

Measurement of Elution Rate

The radiation-sensitive resin composition was spin-coated onto a silicon wafer using "CLEAN TRACK ACT 8" (manufactured by Tokyo Electron Ltd.), and baked (100° C., 60 seconds) to form a resist film having a thickness of 150 nm. Seven Teflon (registered trademark) rings (inner diameter: 2 cm, thickness: 4 mm) were placed on the resist film at arbitrary positions. 1 ml of ultrapure water was provided inside each ring so that the ultrapure water came in contact with the resist film. The ultrapure water was sequentially collected from an arbitrary ring using a glass syringe when 3, 5, 10, 30, 60, 120, and 300 seconds had elapsed after the ultrapure water came in contact with the resist film to obtain analysis samples. Specifically, the ultrapure water was collected from a first ring when 3 seconds had elapsed, and the ultrapure water was collected from a second ring when 5 seconds had elapsed. In this way, the ultrapure water was collected from a seventh ring, finally. The average recovery rate of the ultrapure water from each ring was 95% or more.

The peak intensity of the anion moiety of the acid generator eluted into the ultrapure water (analysis sample) was measured using a liquid chromatograph mass spectrometer (LC-MS) (LC section: "SERIES 1100" manufactured by AGILENT Corporation, MS section: "Mariner" manufactured by PerSeptive Biosystems, Inc.) for all analysis samples. A column "CAPCELL PAK MG" (manufactured by Shiseido Co., Ltd.) was used for the measurement. The flow rate was 0.2 ml/min, and the measurement temperature was 35° C. A mixture prepared by adding formic acid (0.1 mass %) to a water/methanol (3/7) mixture was used as the eluant.

The peak intensity of an acid generator aqueous solution (concentration: 1 ppb, 10 ppb, or 100 ppb) was measured under the above measurement conditions, and a calibration curve was drawn. The elution amount (mol) of the acid generator was calculated from the peak intensity of each analysis sample using the calibration curve. The elution amount (mol) from 1 cm$^2$ of the resist film per second (i.e., elution rate (mol/cm$^2$/sec)) was calculated from the elution amount (mol), the collection time (sec), and the area (cm$^2$) of the surface of the resist film that came in contact with the ultrapure water, and the average elution rate of all of the analysis samples was calculated. The elution rate was evaluated using the average elution rate. A case where the elution rate was 2.0×10$^{-12}$ mol/cm$^2$/sec or more was evaluated as "Unacceptable", and a case where the elution rate was less than 20× 10$^{-12}$ mol/cm$^2$/sec was evaluated as "Acceptable" (see the item "Elution rate" in Table 4).

Difference Between Advancing Contact Angle and Receding Contact Angle

The radiation-sensitive resin composition was spin-coated onto a substrate using "CLEAN TRACK ACT 8" (manufactured by Tokyo Electron Ltd.), and prebaked (PB) at 100° C. for 60 seconds to form a resist film having a thickness of 100 nm. The receding contact angle (°) was immediately measured by the following method at a temperature of 23° C. (room temperature) and a humidity of 45% under atmospheric pressure using "DSA-10" (manufactured by KRUS).

Specifically, the position of the wafer stage of "DSA-10" (manufactured by KRUS) was adjusted, and the substrate was placed on the wafer stage. After injecting water into the needle, the position of the needle was finely adjusted to the initial position at which a water droplet can be formed on the substrate. Water was discharged from the needle to form a water droplet (25 μl) in a state in which the tip of the needle was introduced into the water droplet. After removing the needle from the water droplet, the needle was moved downward to the initial position (i.e., the tip of the needle was introduced into the water droplet). The water droplet was sucked through the needle for 90 seconds at a rate of 10 μl/min, and the contact angle formed by the liquid surface of the water droplet and the substrate was measured every second (90 times in total (i.e., 90 seconds)). The average value of twenty contact angles (20 seconds) measured after the measured value became stable was calculated, and taken as the receding contact angle.

The advancing contact angle was measured by the following method. Specifically, a water droplet (25 μl) was formed in the same manner as in the case of measuring the receding contact angle. After removing the needle from the water droplet, the needle was moved downward to the initial position (i.e., the tip of the needle was introduced into the water droplet). Water was discharged into the water droplet through the needle for 90 seconds at a rate of 10 μl/min, and the contact angle formed by the liquid surface of the water droplet and the substrate was measured every second (90 times in total (i.e., 90 seconds)). The average value of twenty contact angles (20 seconds) measured after the measured value became stable was calculated, and taken as the advancing contact angle.

The difference (advancing contact angle–receding contact angle) between the advancing contact angle (°) and the receding contact angle (°) was calculated from the measured values, and evaluated in accordance with the following standard (see the item "Difference between RCA and ACA" in Table 4).
A: The absolute value of the difference between the advancing contact angle and the receding contact angle was less than 20°.
B: The absolute value of the difference between the advancing contact angle and the receding contact angle was 20° or more.
Measurement of Acid Diffusion Length A resin composition ("ARC29A" manufactured by Brewer Science) was spin-coated onto a substrate using "CLEAN TRACK ACT 8" (manufactured by Tokyo Electron Ltd.), and prebaked (PB) at 100° C. for 60 seconds to form an underlayer film having a thickness of 300 nm. The radiation-sensitive composition was spin-coated onto the underlayer film using "CLEAN TRACK ACT 8" (manufactured by Tokyo Electron Ltd.), and prebaked (PB) at 90° C. for 60 seconds to form a resist film having a thickness of 90 nm. The resist film was exposed via a given mask pattern using a full-field reduction projection aligner ("S306C" manufactured by Nikon Corporation, NA 0.78). After subjecting the resist film to PEB at 100° C. for 60 seconds, the resist film was developed at 25° C. for 30 seconds using a 2.38 mass % tetramethylammonium hydroxide aqueous solution (hereinafter referred to as "TMAH aqueous solution"), rinsed with water, and dried. The residual thickness of the resist film was then measured. The acid diffusion length was calculated from the dose and the residual thickness using Fick's first law, and evaluated in accordance with the following standard. Note that the acid diffusion length is an index of acid concentration control (see the item "Acid diffusion length" in Table 4).
A: The absolute value of the acid diffusion length was less than 3 $nm^2/sec$.
B: The absolute value of the acid diffusion length was 3 $nm^2/sec$ or more.
Cross-Sectional Shape of Pattern A 12-inch silicon wafer on which an underlayer antireflective film (thickness: 77 nm) was formed on the surface was used as a substrate. A resin composition ("ARC29A" manufactured by Brewer Science) was used as the material for the underlayer antireflective film. The underlayer antireflective film was formed using "CLEAN TRACK ACT 8" (manufactured by Tokyo Electron Ltd.).

A resist film was formed on the substrate using the radiation-sensitive resin composition (step (1)). Specifically, the radiation-sensitive resin composition was spin-coated onto the 12-inch silicon wafer (substrate) using "CLEAN TRACK ACT 8" (manufactured by Tokyo Electron Ltd.), and prebaked (PB) at 100° C. for 60 seconds to form a resist film having a thickness of 205 nm.

The resist film was exposed via an immersion liquid provided over the resist film (step (2)). Specifically, purified water was provided over the resist film as the immersion liquid, and the resist film was exposed via the purified water and a mask pattern using an ArF excimer laser exposure system ("NSR S306C" manufactured by Nikon Corporation, NA 0.78, sigma: 0.93/0.69). The exposed resist film was subjected to PEB at 120° C. for 60 seconds.

The exposed resist film was developed to form a resist pattern (step (3)). Specifically, the resist pattern subjected to PEB was developed at 23° C. for 30 seconds using a 2.38 mass % tetramethylammonium hydroxide aqueous solution, rinsed with water, and dried to form a line-and-space (1L1S) pattern having a line width of 90 nm.

The cross-sectional shape of the line-and-space pattern (in the thickness direction) was observed using "S-4800" (manufactured by Hitachi High-Technologies Corporation), and the line width Lb in an intermediate area of the resist film in the thickness direction and the line width La at the surface of the resist film were measured. Then, La/Lb is calculated. A case where the expression "0.9≤La/Lb≤1.1" was satisfied was evaluated as "Acceptable", and a case where the expression "0.9≤La/Lb≤1.1" was not satisfied was evaluated as "Unacceptable" (see the item "Pattern shape" in Table 4).

Synthesis Example 1

14.42 g (10 mol %) of a monomer shown by the following formula (M-3) (hereinafter may be referred to as "monomer (M-3)"), 27.01 g (30 mol %) of a monomer shown by the following formula (M-2) (hereinafter may be referred to as "monomer (M-2)"), and 58.57 g (60 mol %) of a monomer shown by the following formula (M-1) (hereinafter may be referred to as "monomer (M-1)") were dissolved in 150 g of 2-butanone, and 6.17 g (5 mol %) of dimethyl 2,2'-azobis(2-methylpropionate) (initiator) was added to the solution to prepare a monomer solution. A three-necked flask (500 ml) equipped with a thermometer and a dropping funnel was charged with 50 g of 2-butanone, and purged with nitrogen for 30 minutes. The liquid contained in the flask was heated to 80° C. with stirring using a magnetic stirrer. The monomer solution was added dropwise to the 2-butanone over 3 hours using the dropping funnel. The monomers were polymerized for 6 hours from the start of addition of the monomer solution. After completion of polymerization, the polymer solution was cooled with water to 30° C. or less. After cooling, the polymer solution was added to 1000 g of hexane to precipitate a white substance. The white substance was filtered off, and redissolved in 200 g of 2-butanone. The solution was added to 1000 g of hexane to reprecipitate a white substance. The white substance was filtered off, and subjected to the above redissolving and filtrating operation again. The resulting white substance was dried at 50° C. for 17 hours to obtain a white powdery copolymer (38 g, yield: 75%). The copolymer is hereinafter referred to as "polymer (A-1)".

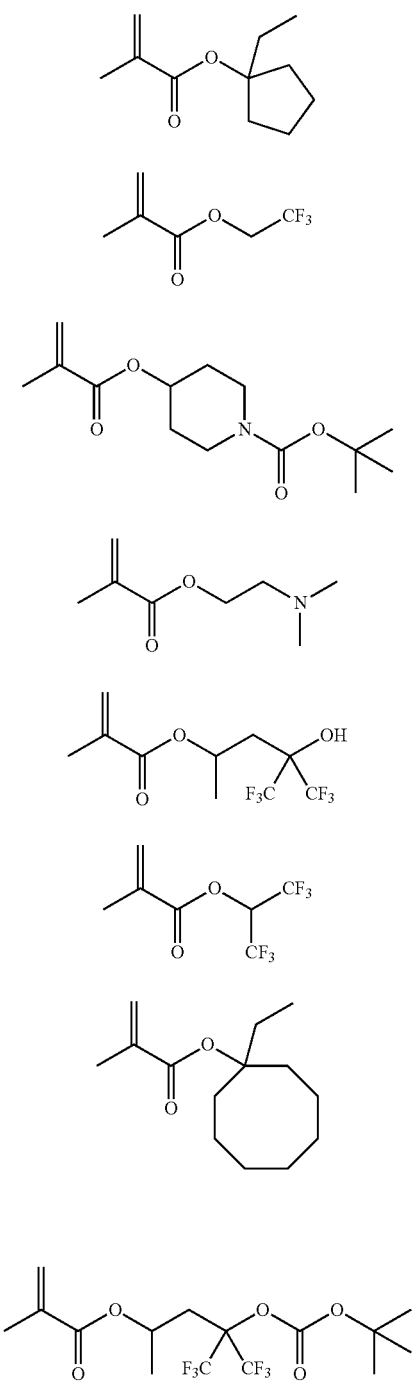

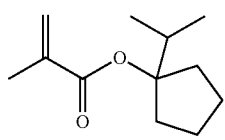

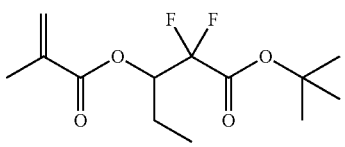

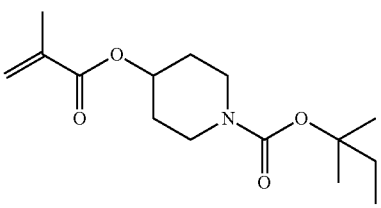

The polymer (A-1) had an Mw of 6100 and Mw/Mn of 1.4. The content of repeating units derived from the monomer (M-1) was 58 mol % based on the total repeating units (=100 mol %) derived from the monomers (M-1), (M-2), and (M-3). The content of repeating units derived from the monomer (M-2) was 31 mol % based on the total repeating units (=100 mol %) derived from the monomers (M-1), (M-2), and (M-3). The content of repeating units derived from the monomer (M-3) was 11 mol % based on the total repeating units (=100 mol %) derived from the monomers (M-1), (M-2), and (M-3). The measurement results are shown in Table 2.

Synthesis Examples 2 to 7 and 9

Polymers (A-2) to (A-8) were synthesized in the same manner as in Synthesis Example 1, except that the compounds shown in Table 1 were used in the amounts (mol %) shown in Table 1. The weight average molecular weight (Mw) and Mw/Mn of each polymer, and the content of respective repeating units in each polymer are shown in Table 2.

In Table 1, the item "Specific monomer" indicates a monomer that produces the repeating unit (I), the item "Fluorine atom-containing monomer" indicates a monomer that produces the repeating unit (II) (repeating unit (IV)), the item "Acid-labile group-containing monomer" indicates a monomer that produces an additional repeating unit (i.e., a repeating unit other than the repeating unit (I) (repeating unit (III)) and the repeating unit (II) (repeating unit (IV))) that includes an acid-labile group, and the item "Additional monomer" indicates a monomer that produces an additional repeating unit other than the additional repeating unit that includes an acid-labile group. "M-1" to "M-11" in Table 1 refer to the compounds shown by the formulas (M-1) to (M-11), respectively.

TABLE 1

| | Polymer | Specific monomer Type | Amount (mol %) | Fluorine atom-containing monomer Type | Amount (mol %) | Type | Amount (mol %) | Acid-labile group-containing monomer Type | Amount (mol %) | Additional monomer Type | Amount (mol %) | Monomer (M-A) (mol %) | Monomer (M-B) (mol %) | Monomer (M-C) (mol %) |
|---|---|---|---|---|---|---|---|---|---|---|---|---|---|---|
| Synthesis Example 1 | A-1 | M-3 | 10 | M-2 | 30 | — | — | M-1 | 60 | — | — | — | — | — |
| Synthesis Example 2 | A-2 | M-3 | 10 | M-6 | 15 | — | — | M-1 | 75 | — | — | — | — | — |
| Synthesis Example 3 | A-3 | M-3 | 10 | M-8 | 22 | — | — | M-7 | 68 | — | — | — | — | — |
| Synthesis Example 4 | A-4 | M-3 | 10 | M-10 | 25 | M-5 | 15 | M-9 | 50 | — | — | — | — | — |
| Synthesis Example 5 | A-5 | M-3 | 10 | M-10 | 25 | M-5 | 15 | M-7 | 50 | — | — | — | — | — |
| Synthesis Example 6 | A-6 | — | — | M-2 | 30 | — | — | M-1 | 60 | M-4 | 10 | — | — | — |
| Synthesis Example 7 | A-7 | — | — | M-2 | 30 | M-5 | 10 | M-1 | 60 | — | — | — | — | — |
| Synthesis Example 8 | B-1 | — | — | — | — | — | — | — | — | — | — | 35 | 15 | 50 |
| Synthesis Example 9 | A-8 | M-11 | 10 | M-2 | 30 | — | — | M-1 | 60 | — | — | — | — | — |

TABLE 2

| | Polymer | Monomer | Content (mol %) | Monomer | Content (mol %) | Monomer | Content (mol %) | Monomer | Content (mol %) | Mw | Mw/Mn |
|---|---|---|---|---|---|---|---|---|---|---|---|
| Synthesis Example 1 | A-1 | M-1 | 58 | M-2 | 31 | M-3 | 11 | — | — | 6100 | 1.4 |
| Synthesis Example 2 | A-2 | M-1 | 75 | M-6 | 15 | M-3 | 10 | — | — | 6200 | 1.4 |
| Synthesis Example 3 | A-3 | M-7 | 68 | M-8 | 22 | M-3 | 10 | — | — | 6100 | 1.4 |
| Synthesis Example 4 | A-4 | M-9 | 50 | M-10 | 25 | M-5 | 15 | M-3 | 10 | 5900 | 1.4 |
| Synthesis Example 5 | A-5 | M-7 | 50 | M-10 | 25 | M-5 | 15 | M-3 | 10 | 6100 | 1.4 |
| Synthesis Example 6 | A-6 | M-1 | 59 | M-2 | 30 | M-4 | 11 | — | — | 5800 | 1.4 |
| Synthesis Example 7 | A-7 | M-1 | 60 | M-2 | 30 | M-5 | 10 | — | — | 6200 | 1.4 |
| Synthesis Example 8 | B-1 | M-A | 36 | M-B | 15 | M-C | 49 | — | — | 6500 | 1.6 |
| Synthesis Example 9 | A-8 | M-1 | 59 | M-2 | 31 | M-11 | 10 | — | — | 5900 | 1.5 |

Synthesis Example 8

A polymer (B) was synthesized as described below. 14.20 g (35 mol %) of a monomer shown by the following formula (M-A) (hereinafter may be referred to as "monomer (M-A)"), 8.99 g (15 mol %) of a monomer shown by the following formula (M-B) (hereinafter may be referred to as "monomer (M-B)"), and 26.81 g (50 mol %) of a monomer shown by the following formula (M-C) (hereinafter may be referred to as "monomer (M-C)") were dissolved in 100 g of 2-butanone, and 2.78 g (5 mol %) of dimethyl 2,2'-azobis(2-methylpropionate) (initiator) was added to the solution to prepare a monomer solution.

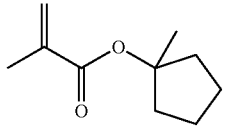

(M-A)

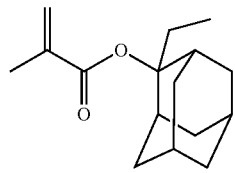

(M-B)

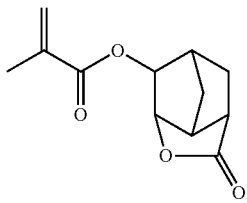

(M-C)

A three-necked flask (500 ml) equipped with a thermometer and a dropping funnel was charged with 50 g of 2-butanone, and purged with nitrogen for 30 minutes. The liquid contained in the flask was heated to 80° C. with stirring using a magnetic stirrer. The monomer solution was added dropwise to the 2-butanone over 3 hours using the dropping funnel. The monomers were polymerized for 6 hours from the start of addition of the monomer solution. After completion of polymerization, the polymer solution was cooled with water to 30° C. or less. After cooling, the polymer solution was added to 1000 g of hexane to precipitate a white substance. The white substance was filtered off, and redissolved in 200 g of 2-butanone. The solution was added to 1000 g of hexane to reprecipitate a white substance. The white substance was filtered off, and subjected to the above redissolving and filtrating operation again. The resulting white substance was dried at 50° C. for 17 hours to obtain a white powdery copolymer (38 g, yield: 75%). The copolymer is hereinafter referred to as "polymer (B-1)".

The polymer (B-1) obtained had an Mw of 6500 and Mw/Mn of 1.6. The content of repeating units derived from the monomer (M-A) was 36 mol % based on the total repeating units (=100 mol %) derived from the monomers (M-A), (M-B), and (M-C). The content of repeating units derived from the monomer (M-B) was 15 mol % based on the total repeating units (=100 mol %) derived from the monomers (M-A), (M-B), and (M-C). The content of repeating units derived from the monomer (M-C) was 49 mol % based on the total repeating units (=100 mol %) derived from the monomers (M-A), (M-B), and (M-C). The measurement results are shown in Table 2.

Example 1

2 parts of the polymer (A-1) obtained in Synthesis Example 1, 100 parts of the polymer (B-1) obtained in Synthesis Example 8, and 10.8 parts of the compound shown by the following formula (C-1) (radiation-sensitive acid generator (C)) ("Acid generator (C)" in Table 3) were mixed, and dissolved in propylene glycol monomethyl ether acetate (solvent). The solution was filtered through a filter having a pore size of 0.02 μm to prepare a radiation-sensitive resin composition (composition solution) having a solid content of 5%. The radiation-sensitive resin composition was evaluated as described above.

(C-1)
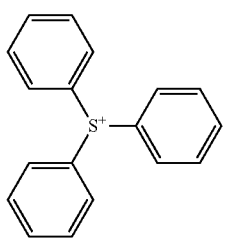

-continued (C-2)
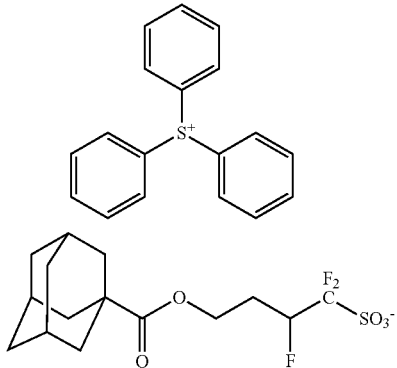

(C-3)
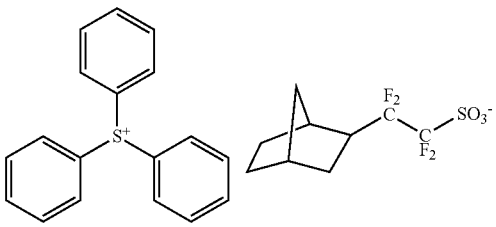

(C-4)
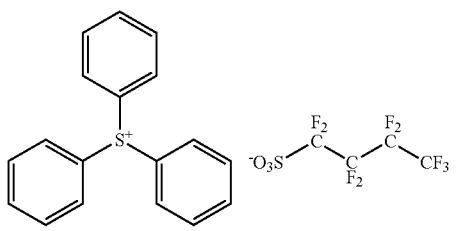

(C-5)
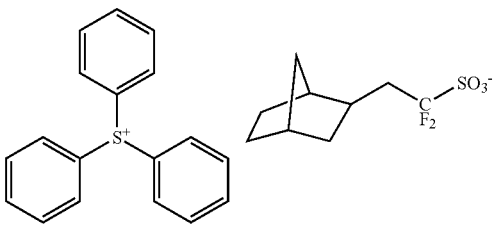

When using the radiation-sensitive resin composition obtained in Example 1, the elution amount was evaluated as "Acceptable", the difference between the advancing contact angle and the receding contact angle was evaluated as "A", the acid diffusion length was evaluated as "A", and the cross-sectional shape of the pattern was evaluated as "Acceptable".

Examples 2 to 11 and Comparative Examples 1 and 2

A radiation-sensitive resin composition was prepared in the same manner as in Example 1, except that the components shown in Table 3 were used in the amounts (parts by mass) shown in Table 3. The radiation-sensitive resin composition was evaluated as described above. The evaluation results are shown in Table 4. Note that "C-1" to "C-5" in Table 3 refer to the compounds shown by the formulas (C-1) to (C-5), respectively.

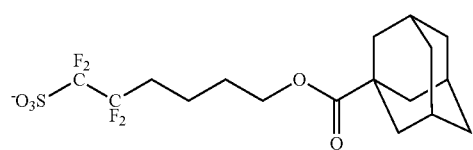

TABLE 3

| | Polymer (A) | | Polymer (B) | | Acid generator (C) | |
|---|---|---|---|---|---|---|
| | Type | Amount (parts) | Type | Amount (parts) | Type | Amount (parts) |
| Example 1 | A-1 | 2 | B-1 | 100 | C-1 | 10.8 |
| Example 2 | A-2 | 2 | B-1 | 100 | C-1 | 10.8 |
| Example 3 | A-3 | 2 | B-1 | 100 | C-1 | 10.8 |
| Example 4 | A-4 | 2 | B-1 | 100 | C-1 | 10.8 |
| Example 5 | A-5 | 2 | B-1 | 100 | C-1 | 10.8 |
| Example 6 | A-1 | 5 | B-1 | 100 | C-1 | 10.8 |
| Example 7 | A-1 | 2 | B-1 | 100 | C-2 | 10.8 |
| Example 8 | A-1 | 2 | B-1 | 100 | C-3 | 10.8 |
| Example 9 | A-1 | 2 | B-1 | 100 | C-4 | 10.8 |
| Example 10 | A-1 | 2 | B-1 | 100 | C-5 | 10.8 |
| Example 11 | A-8 | 2 | B-1 | 100 | C-1 | 10.8 |
| Comparative Example 1 | A-6 | 2 | B-1 | 100 | C-1 | 10.8 |
| Comparative Example 2 | A-7 | 2 | B-1 | 100 | C-1 | 10.8 |

TABLE 4

| | Elution rate | Difference between RCA and ACA | Acid diffusion length | Pattern shape |
|---|---|---|---|---|
| Example 1 | Acceptable | A | A | Acceptable |
| Example 2 | Acceptable | A | A | Acceptable |
| Example 3 | Acceptable | A | A | Acceptable |
| Example 4 | Acceptable | A | A | Acceptable |
| Example 5 | Acceptable | A | A | Acceptable |
| Example 6 | Acceptable | A | A | Acceptable |
| Example 7 | Acceptable | A | A | Acceptable |
| Example 8 | Acceptable | A | A | Acceptable |
| Example 9 | Acceptable | A | A | Acceptable |
| Example 10 | Acceptable | A | A | Acceptable |
| Example 11 | Acceptable | A | A | Acceptable |
| Comparative Example 1 | Unacceptable | B | B | Unacceptable |
| Comparative Example 2 | Acceptable | B | B | Unacceptable |

As is clear from Table 4, it was confirmed that the radiation-sensitive resin compositions of Examples 1 to 11 could form a resist pattern having an excellent cross-sectional shape as compared with the radiation-sensitive resin compositions of Comparative Examples 1 and 2.

The radiation-sensitive resin composition according to the embodiment of the invention may suitably be used as a material for forming a resist film that is used for lithography in the field of microprocessing represented by production of integrated circuit devices. The resist pattern-forming method according to the embodiment of the invention may suitably be used for lithography in the field of microprocessing represented by production of integrated circuit devices. The polymer according to the embodiment of the invention may suitably be used as a material for forming a resist film that is used for lithography in the field of microprocessing represented by production of integrated circuit devices.

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation-sensitive resin composition comprising:
a first polymer including a repeating unit (I) shown by a general formula (1), and a fluorine atom in a molecule of the first polymer;
a second polymer including an acid-labile group, being insoluble or scarcely soluble in an alkali, and not including the repeating unit (I) shown by the general formula (1); and
a radiation-sensitive acid generator,

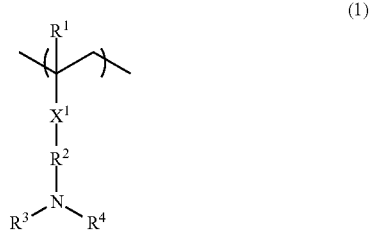

wherein
$R^1$ represents a hydrogen atom, a methyl group, or a trifluoromethyl group,
$X^1$ represents a single bond, a group shown by —O—$R^5$—, a group shown by —C(=O)—O—$R^5$—, a group shown by —C(=O)—NH—$R^5$—, a linear or branched alkanediyl group having 1 to 4 carbon atoms, or a phenylene group, wherein $R^5$ represents a single bond, or a linear, branched, or cyclic hydrocarbon group having 1 to 10 carbon atoms which optionally includes an ester group or an ether group,
$R^2$ represents a linear, branched, or cyclic alkanediyl group having 1 to 20 carbon atoms and being substituted or unsubstituted, a substituted or unsubstituted alkenylene group having 2 to 20 carbon atoms, a substituted or unsubstituted arylene group having 6 to 10 carbon atoms, or a substituted or unsubstituted aralkylene group,
$R^3$ represents a hydrogen atom, a linear, branched, or cyclic alkyl group having 1 to 20 carbon atoms and being substituted or unsubstituted, a substituted or unsubstituted alkenyl group having 2 to 20 carbon atoms, a substituted or unsubstituted aryl group having 6 to 10 carbon atoms, or a substituted or unsubstituted aralkyl group, or
$R^2$ and $R^3$ bond to each other to form a cyclic structure having 3 to 20 carbon atoms together with a nitrogen atom bonded to $R^2$ and $R^3$, and
$R^4$ represents an acid-labile group.

2. The radiation-sensitive resin composition according to claim 1, wherein the repeating unit (I) shown by the general formula (1) is a repeating unit shown by a general formula (1-1),

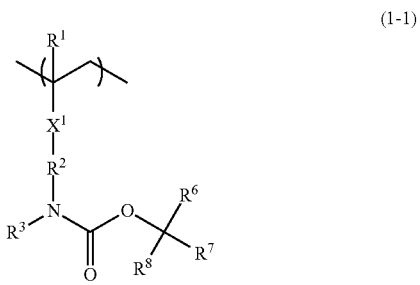

wherein

R$^1$ represents a hydrogen atom, a methyl group, or a trifluoromethyl group,

X$^1$ represents a single bond, a group shown by —O—R$^5$—, a group shown by —C(=O)—O—R$^5$—, a group shown by —C(=O)—NH—R$^5$—, a linear or branched alkanediyl group having 1 to 4 carbon atoms, or a phenylene group, wherein R$^5$ represents a linear, branched, or cyclic hydrocarbon group having 1 to 10 carbon atoms which optionally includes an ester group or an ether group, or a single bond, R$^2$ represents a linear, branched, or cyclic alkanediyl group having 1 to 20 carbon atoms and being substituted or unsubstituted, a substituted or unsubstituted alkenylene group having 2 to 20 carbon atoms, a substituted or unsubstituted arylene group having 6 to 10 carbon atoms, or a substituted or unsubstituted aralkylene group, R$^3$ represents a hydrogen atom, a linear, branched, or cyclic alkyl group having 1 to 20 carbon atoms and being substituted or unsubstituted, a substituted or unsubstituted alkenyl group having 2 to 20 carbon atoms, a substituted or unsubstituted aryl group having 6 to 10 carbon atoms, or a substituted or unsubstituted aralkyl group, or R$^2$ and R$^3$ bond to each other to form a cyclic structure having 3 to 20 carbon atoms together with a nitrogen atom bonded to R$^2$ and R$^3$, and each of R$^6$, R$^7$, and R$^8$ independently represents a linear or branched alkyl group having 1 to 4 carbon atoms, a monovalent alicyclic hydrocarbon group having 4 to 20 carbon atoms, an aryl group, or an aralkyl group, or R$^6$ and R$^7$ bond to each other to form an alicyclic hydrocarbon group having 4 to 20 carbon atoms together with a carbon atom bonded to R$^6$ and R$^7$, and R$^8$ represents a linear or branched alkyl group having 1 to 4 carbon atoms, a monovalent alicyclic hydrocarbon group having 4 to 20 carbon atoms, an aryl group, or an aralkyl group.

3. The radiation-sensitive resin composition according to claim 1, wherein the first polymer further includes a repeating unit shown by a general formula (2-1), a repeating unit shown by a general formula (2-2), or both thereof,

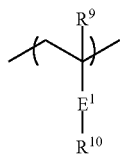
(2-1)

wherein

R$^9$ represents a hydrogen atom, a methyl group, or a trifluoromethyl group,

E$^1$ represents a linking group, and

R$^{10}$ represents a linear or branched alkyl group having 1 to 6 carbon atoms and being substituted with at least one fluorine atom, a monovalent alicyclic hydrocarbon group having 4 to 20 carbon atoms and being substituted with at least one fluorine atom, or a derivative thereof,

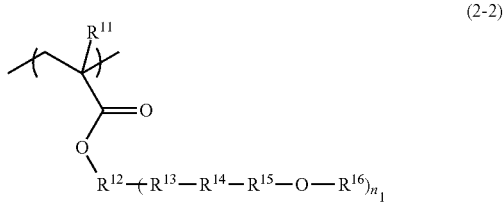
(2-2)

wherein

R$^{11}$ represents a hydrogen atom, a methyl group, or a trifluoromethyl group, R$^{12}$ represents a single bond, or a linear, branched, or cyclic ($n_1$+1)-valent hydrocarbon group having 1 to 10 carbon atoms and being saturated or unsaturated, R$^{13}$ represents a single bond, or a linear, branched, or cyclic divalent hydrocarbon group having 1 to 20 carbon atoms and being saturated or unsaturated, R$^{14}$ represents a methylene group substituted with a fluorine atom, or a linear or branched fluoroalkanediyl group having 2 to 20 carbon atoms, R$^{15}$ represents a single bond or —CO—, R$^{16}$ represents a hydrogen atom or an acid-labile group, and $n_1$ is an integer from 1 to 3.

4. The radiation-sensitive resin composition according to claim 2, wherein the first polymer further includes a repeating unit shown by a general formula (2-1), a repeating unit shown by a general formula (2-2), or both thereof,

(2-1)

wherein

R$^9$ represents a hydrogen atom, a methyl group, or a trifluoromethyl group,

E$^1$ represents a linking group, and

R$^{10}$ represents a linear or branched alkyl group having 1 to 6 carbon atoms and being substituted with at least one fluorine atom, a monovalent alicyclic hydrocarbon group having 4 to 20 carbon atoms and being substituted with at least one fluorine atom, or a derivative thereof,

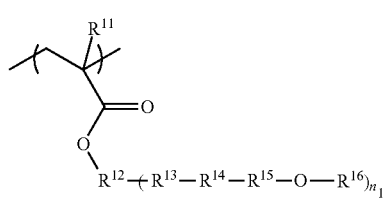
(2-2)

wherein

R$^{11}$ represents a hydrogen atom, a methyl group, or a trifluoromethyl group, R$^{12}$ represents a single bond, or a linear, branched, or cyclic ($n_1$+1)-valent hydrocarbon group having 1 to 10 carbon atoms and being saturated or unsaturated, R$^{13}$ represents a single bond, or a linear, branched, or cyclic divalent hydrocarbon group having 1 to 20 carbon atoms and being saturated or unsaturated, R$^{14}$ represents a methylene group substituted with a fluorine atom, or a linear or branched fluoroalkanediyl group having 2 to 20 carbon atoms, R$^{15}$ represents a single bond or —CO—, R$^{16}$ represents a hydrogen atom or an acid-labile group, and $n_1$ is an integer from 1 to 3.

5. The radiation-sensitive resin composition according to claim 1, wherein the first polymer has a fluorine atom content of 5 mass % or more based on a total amount of the first polymer, and the second polymer has a fluorine atom content of less than 5 mass % based on a total amount of the second polymer.

6. The radiation-sensitive resin composition according to claim 3, wherein the first polymer has a fluorine atom content of 5 mass % or more based on a total amount of the first polymer, and the second polymer has a fluorine atom content of less than 5 mass % based on a total amount of the second polymer.

7. The radiation-sensitive resin composition according to claim 1, wherein the radiation-sensitive resin composition includes the first polymer in an amount of 0.1 to 20 parts by mass based on 100 parts by mass of the second polymer.

8. The radiation-sensitive resin composition according to claim 6, wherein the radiation-sensitive resin composition includes the first polymer in an amount of 0.1 to 20 parts by mass based on 100 parts by mass of the second polymer.

9. The radiation-sensitive resin composition according to claim 1, wherein the radiation-sensitive resin composition is used for liquid immersion lithography.

10. The radiation-sensitive resin composition according to claim 8, wherein the radiation-sensitive resin composition is used for liquid immersion lithography.

11. A resist pattern-forming method comprising:
providing a resist film on a substrate using the radiation-sensitive resin composition according to claim 1;
exposing the resist film; and
developing the exposed resist film to form a resist pattern.

12. A resist pattern-forming method comprising:
providing a resist film on a substrate using the radiation-sensitive resin composition according to claim 10;
exposing the resist film; and
developing the exposed resist film to form a resist pattern.

13. The resist pattern-forming method according to claim 11, wherein an immersion liquid is provided over the resin film, then, the resist film is exposed via the immersion liquid.

14. The resist pattern-forming method according to claim 12, wherein an immersion liquid is provided over the resin film, then, the resist film is exposed via the immersion liquid.

15. A polymer comprising:
a repeating unit (3) shown by a general formula (3); and
a fluorine atom in the molecule of the polymer,

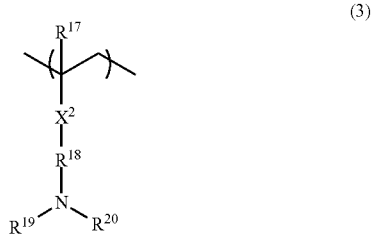

(3)

wherein

R$^{17}$ represents a hydrogen atom, a methyl group, or a trifluoromethyl group, X$^2$ represents a single bond, a group shown by —O—R$^{21}$—, a group shown by —C(=O)—O—R$^{21}$—, a group shown by —C(=O)—NH—R$^{21}$—, a linear or branched alkanediyl group having 1 to 4 carbon atoms, or a phenylene group, wherein R$^{21}$ represents a single bond, or a linear, branched, or cyclic hydrocarbon group having 1 to 10 carbon atoms which optionally includes an ester group or an ether group, R$^{18}$ represents a linear, branched, or cyclic alkanediyl group having 1 to 20 carbon atoms and being substituted or unsubstituted, a substituted or unsubstituted alkenylene group having 2 to 20 carbon atoms, a substituted or unsubstituted arylene group having 6 to 10 carbon atoms, or a substituted or unsubstituted aralkylene group, R$^{19}$ represents a hydrogen atom, a linear, branched, or cyclic alkyl group having 1 to 20 carbon atoms and being substituted or unsubstituted, a substituted or unsubstituted alkenyl group having 2 to 20 carbon atoms, a substituted or unsubstituted aryl group having 6 to 10 carbon atoms, or a substituted or unsubstituted aralkyl group, or R$^{18}$ and R$^{19}$ bond to each other to form a cyclic structure having 3 to 20 carbon atoms together with a nitrogen atom bonded to R$^{18}$ and R$^{19}$, and R$^{20}$ represents an acid-labile group.

16. The polymer according to claim 15, wherein the repeating unit (3) shown by the general formula (3) is a repeating unit shown by a general formula (3-1),

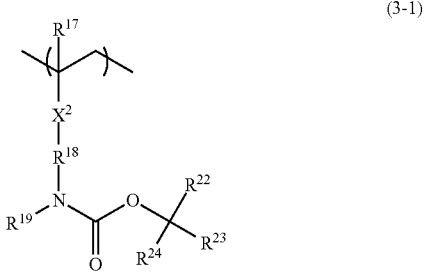

(3-1)

wherein

R$^{17}$ represents a hydrogen atom, a methyl group, or a trifluoromethyl group, X$^2$ represents a single bond, a group shown by —O—R$^{21}$—, a group shown by —C(=O)—O—R$^{21}$—, a group shown by —C(=O)—NH—$R^{21}$—, a linear or branched alkanediyl group having 1 to 4 carbon atoms, or a phenylene group, wherein $R^{21}$ represents a single bond, or a linear, branched, or cyclic hydrocarbon group having 1 to 10 carbon atoms which optionally includes an ester group or an ether group, $R^{18}$ represents a linear, branched, or cyclic alkanediyl group having 1 to 20 carbon atoms and being substituted or unsubstituted, a substituted or unsubstituted alkenylene group having 2 to 20 carbon atoms, a substituted or unsubstituted arylene group having 6 to 10 carbon atoms, or a substituted or unsubstituted aralkylene group, $R^{19}$ represents a hydrogen atom, a linear, branched, or cyclic alkyl group having 1 to 20 carbon atoms and being substituted or unsubstituted, a substituted or unsubstituted alkenyl group having 2 to 20 carbon atoms, a substituted or unsubstituted aryl group having 6 to 10 carbon atoms, or a substituted or unsubstituted aralkyl group, or $R^{18}$ and $R^{19}$ bond to each other to form a cyclic structure having 3 to 20 carbon atoms together with a nitrogen atom bonded to $R^{18}$ and $R^{19}$, and each of $R^{22}$, $R^{23}$, and $R^{24}$ independently represents a linear or branched alkyl group having 1 to 4 carbon atoms, a monovalent alicyclic hydrocarbon group having 4 to 20 carbon atoms, an aryl group, or an aralkyl group, or $R^{22}$ and $R^{23}$ bond to each other to form an alicyclic hydrocarbon group having 4 to 20 carbon atoms together with a carbon atom bonded to $R^{22}$ and $R^{23}$, and $R^{24}$ represents a linear or branched alkyl group having 1 to 4 carbon atoms, a monovalent alicyclic hydrocarbon group having 4 to 20 carbon atoms, an aryl group, or an aralkyl group.

17. The polymer according to claim 15, further comprising:

a repeating unit shown by a general formula (4-1), a repeating unit shown by a general formula (4-2), or both thereof,

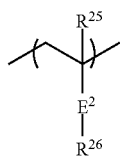

(4-1)

wherein $R^{25}$ represents a hydrogen atom, a methyl group, or a trifluoromethyl group, $E^2$ represents a linking group, and $R^{26}$ represents a linear or branched alkyl group having 1 to 6 carbon atoms and being substituted with at least one fluorine atom, a monovalent alicyclic hydrocarbon group having 4 to 20 carbon atoms and being substituted with at least one fluorine atom, or a derivative thereof,

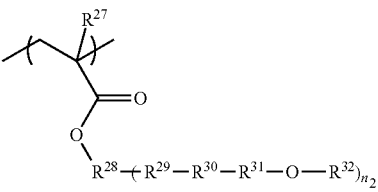

(4-2)

wherein $R^{27}$ represents a hydrogen atom, a methyl group, or a trifluoromethyl group, $R^{28}$ represents a single bond or a linear, branched, or cyclic ($n_2$+1)-valent hydrocarbon group having 1 to 10 carbon atoms and being saturated or unsaturated, $R^{29}$ represents a single bond or a linear, branched, or cyclic divalent hydrocarbon group having 1 to 20 carbon atoms and being saturated or unsaturated, $R^{30}$ represents a methylene group substituted with a fluorine atom, or a linear or branched fluoroalkanediyl group having 2 to 20 carbon atoms, $R^{31}$ represents a single bond or —CO—, $R^{32}$ represents a hydrogen atom or an acid-labile group, and $n_2$ is an integer from 1 to 3.

18. The polymer according to claim 16, further comprising:

a repeating unit shown by a general formula (4-1), a repeating unit shown by a general formula (4-2), or both thereof,

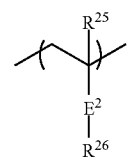

(4-1)

wherein $R^{25}$ represents a hydrogen atom, a methyl group, or a trifluoromethyl group, $E^2$ represents a linking group, and $R^{26}$ represents a linear or branched alkyl group having 1 to 6 carbon atoms and being substituted with at least one fluorine atom, a monovalent alicyclic hydrocarbon group having 4 to 20 carbon atoms and being substituted with at least one fluorine atom, or a derivative thereof,

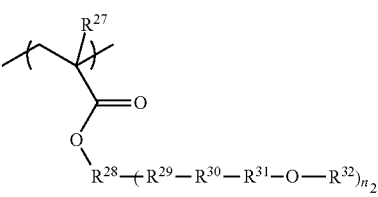

(4-2)

wherein $R^{27}$ represents a hydrogen atom, a methyl group, or a trifluoromethyl group, $R^{28}$ represents a single bond or a linear, branched, or cyclic ($n_2$+1)-valent hydrocarbon group having 1 to 10 carbon atoms and being saturated or unsaturated, $R^{29}$ represents a single bond or a linear, branched, or cyclic divalent hydrocarbon group having 1 to 20 carbon atoms and being saturated or unsaturated, $R^{30}$ represents a methylene group substituted with a fluorine atom, or a linear or branched fluoroalkanediyl group having 2 to 20 carbon atoms, $R^{31}$ represents a single bond or —CO—, $R^{32}$ represents a hydrogen atom or an acid-labile group, and $n_2$ is an integer from 1 to 3.

* * * * *